(12) United States Patent
Yoneda

(10) Patent No.: US 7,159,200 B2
(45) Date of Patent: Jan. 2, 2007

(54) SEMICONDUCTOR EQUIPMENT

(75) Inventor: Takashi Yoneda, Mishima-gun (JP)

(73) Assignee: Matsushita Electric Industrial Co., Ltd. (JP)

( * ) Notice: Subject to any disclaimer, the term of this patent is extended or adjusted under 35 U.S.C. 154(b) by 239 days.

(21) Appl. No.: 10/887,861

(22) Filed: Jul. 12, 2004

(65) Prior Publication Data

US 2005/0007171 A1   Jan. 13, 2005

(30) Foreign Application Priority Data

Jul. 10, 2003 (JP) .............................. 2003-272631

(51) Int. Cl.
*G06F 17/50* (2006.01)
(52) U.S. Cl. ............................................. 716/6; 716/5
(58) Field of Classification Search ............... 716/1, 716/2, 6, 18; 327/199
See application file for complete search history.

(56) References Cited

U.S. PATENT DOCUMENTS

| | | | |
|---|---|---|---|
| 5,617,563 A | 4/1997 | Banerjee et al. ............ 395/556 |
| 5,841,305 A | 11/1998 | Wilson ........................ 327/175 |
| 6,489,833 B1 * | 12/2002 | Miyazaki et al. ........... 327/534 |
| 6,564,359 B1 * | 5/2003 | Saeki ............................. 716/5 |
| 2002/0079938 A1 * | 6/2002 | Saeki ......................... 327/165 |
| 2003/0200518 A1 * | 10/2003 | Saeki ............................. 716/6 |
| 2004/0046596 A1 * | 3/2004 | Kaeriyama et al. ......... 327/165 |

* cited by examiner

*Primary Examiner*—Jack Chiang
*Assistant Examiner*—Binh Tat
(74) *Attorney, Agent, or Firm*—Steptoe & Johnson LLP

(57) ABSTRACT

A duty of a system clock is changed by a duty changing circuit, and a phase difference is provided between a current consumed at a leading edge of the system clock and a current consumed at a trailing edge thereof in an internal circuit, so as to shift phases of consumed currents away from each other. Thereby, frequency components concentrating on frequencies each of an even order frequency of the system clock can be cancelled and harmonic components each of a frequency of an even order in a current be reduced. Thus, a semiconductor equipment with less electromagnetic interference can be realized.

13 Claims, 16 Drawing Sheets

CURRENT SPECTRUM AFTER CHANGE IN DUTY RATIO (DUTY RATIO=52%)

COMPARISON OF CURRENT SPECTRUM AFTER CHANGE IN DUTY RATIO

DUTY CHANGING CIRCUIT (a) SOURCE CLOCK S101

(b) SYSTEM CLOCK S103

(c) SYSTEM CLOCK S103 (DUTY SETTING 1)

(d) SYSTEM CLOCK S103 (DUTY SETTING 2)

FREQUENCY COMPONENTS OF EVEN NUMBER ORDERS

FREQUENCY COMPONENTS OF ODD NUMBER ORDERS

SEMICONDUCTOR EQUIPMENT

BACKGROUND OF THE INVENTION

1. Field of the Invention

The present invention relates to a semiconductor equipment with an internal circuit operating in synchronism with a system clock signal.

2. Description of the Related Art

In an internal circuit of a semiconductor equipment, an internal element repeats switching at high speed in synchronism with a signal called as a system clock. As a result of this, harmonic currents flow in the internal circuit and the harmonic currents flow out to outside to cause problems such as electromagnetic interference.

Following the increase in complexity of integration in a semiconductor equipment in recent years, a circuit scale has become larger and a synchronization design takes a dominant position in LSI design methods. This synchronization design method is such that an operation timing in the internal circuit is fixed at one of a rise and fall of a system clock to thereby enjoy an advantage that introduction of static timing verification is enabled, leading to better efficiency in timing design and improved completeness of timing design.

On the other hand, as a constraint accompanying this advantage, a necessity arises that a system clock is required to simultaneously change in all regions in the internal circuit. Therefore, timing compensation in propagation of a system clock in the internal circuit is ensured by application of a technique such as CTS (clock tree synthesis).

Along with the increase in circuit scale, a circuit scale of CTS also becomes larger, which though it is natural, enhances a consumed current in CTS and further, results in a state where power supply harmonics generated by the CTS circuit cannot be neglected.

Description will be given of a conventional semiconductor equipment with an internal circuit operating in synchronism with a system clock signal below.

FIG. 19 shows a conventional semiconductor equipment.

In a semiconductor chip 101 as a semiconductor equipment, a numerical symbol 2 is an oscillating circuit section to which an oscillator or an oscillating unit is connected. A numerical symbol 4 is an internal circuit of the semiconductor chip 101, which is constituted of a CTS circuit 5 to which a system clock from the oscillating circuit section 2 is inputted and an operation circuit section 6 operating in synchronism with the system clock signal that is outputted from the CTS circuit 5 and that has been timing-adjusted.

FIG. 20 is a signal waveform diagram of the semiconductor equipment shown in FIG. 19 and FIG. 21 is a current spectrum chart thereof.

A system clock generated in the oscillating circuit section 2 is compensated with respect to a timing of a signal change in the CTS circuit 5 and is simultaneously inputted to all of circuit elements constituting the operation circuit section 6.

All of the circuit elements constituting the operation circuit section 6 simultaneously start signal changes at a leading edge of the system clock.

On the other hand, generated in a CMOS circuit is a charging/discharging current required for changes in potential of a through current and a signal line respectively in transition of the signal.

Therefore, in the CTS circuit 5, as shown in FIG. 20, a current is consumed at each of a leading edge and trailing edge of the system clock, while in the operation circuit section 6, a current is consumed only at an leading edge of the system clock. FIG. 21 shows a present state of generation of upper harmonics in a case where a duty ratio is 50%. In FIG. 21, the first current component in the current spectrum is the second harmonic of the system clock and the next current component therein is the fourth harmonic thereof.

With further increase in circuit scale, the CTS circuit 5 also becomes larger and a proportion of a total consumed current in the semiconductor chip 101 accounted for by a consumed current in the CTS circuit 5 has been more and more increased partly because of a transition probability of a signal is 100%.

Herein, since a current in the CTS circuit 5 is consumed at each timing of a leading edge and a trailing edge, a current change occurs at a frequency twice that of the system clock. As a consumed current in the semiconductor chip 101, harmonics are generated based on a frequency twice that of the system clock. As a result, harmonics of an even number order of the system clock increase in amount.

The present invention has been made in order to solve the problem and it is an object of the present invention to provide a semiconductor equipment with less electromagnetic interference.

DISCLOSURE OF THE INVENTION

In order to achieve the object, realized in the present invention is a semiconductor equipment with less electromagnetic interference, which is obtained by shifting the phase of a current consumed in a CTS circuit by changing a duty ratio of a system clock thereby to cancel frequency components concentrating on frequencies of even number orders of the system clock.

The semiconductor equipment of the present invention includes: an oscillating circuit section to which an oscillator or an oscillating unit is connected and outputting a source clock; an internal circuit operating in synchronism with a system clock; and a duty changing circuit changing a duty of the source clock outputted from the oscillating circuit section to a predetermined duty shifted away from a value in the vicinity of 50% to output the resultant source clock to the internal circuit as a system clock, wherein the internal circuit includes: an operation circuit section operating in synchronism with one of a leading edge and trailing edge of the system clock; and a CTS circuit adjusting an arrival timing of the system clock at the operation circuit section.

In the semiconductor equipment of the present invention, the duty changing circuit includes: a logic gate to the input of which the source clock outputted from the oscillating circuit section is supplied directly and through signal paths having respective different delay amounts, and that calculates a logical sum or logical product of signals through the signal paths and the source clock to output the logical sum or the logical product as the system clock.

With this construction, since a duty ratio is changed with a difference in delay amount between a first signal path and a second signal path as a difference between a high period and low period of a system lock, no change occurs of an edge cycle of the system clock with which the internal circuit operates; therefore, no necessity arises for second timing verification and frequency components concentrating on frequencies of even number orders of the system clock are cancelled with ease, thereby enabling the semiconductor equipment with less electromagnetic interference to be obtained.

In the semiconductor equipment of the present invention, the duty changing circuit includes: a delay generating section in which a plurality of delay elements are connected in series to each other and to the input of which the source clock outputted from the oscillating circuit section is supplied; a first logic gate calculating a logic product of a plurality of outputs from arbitrary stages of the plurality of delay elements constituting the delay generating section; a second logic gate calculating a logic sum of a plurality of outputs from arbitrary stages of the plurality of delay elements constituting the delay generating section; and a latch circuit changing over between a high output and low output according to output signals of the first logic gate and the second logic gate to output one of the high output and low output as the system clock, wherein the signal with the largest delay amount outputted from the delay generating section is inputted only to the first logic gate.

In the semiconductor equipment of the present invention, the duty changing circuit includes: a delay generating section in which a plurality of delay elements are connected in series to each other and to the input of which the source clock outputted from the oscillating circuit section is supplied; a first logic gate calculating a logic product of a plurality of outputs from arbitrary stages of the plurality of delay elements constituting the delay generating section; a second logic gate calculating a logic sum of a plurality of outputs from arbitrary stages of the plurality of delay elements constituting the delay generating section; and a latch circuit changing over between a high output and low output according to output signals of the first logic gate and the second logic gate to output one of the high output and low output as the system clock, wherein the signal with the largest delay amount outputted from the delay generating section is inputted only to the second logic gate.

In the semiconductor equipment of the present invention, the duty changing circuit in which one of signal paths having respective different delay amounts through which the source clock outputted from the oscillating circuit section is outputted is selected by a selection circuit includes a logic gate from which a logic sum or logic product of an output of the selection circuit and the source clock is outputted as the system clock.

In the semiconductor equipment of the present invention, the duty changing circuit further includes: a setting circuit selecting a plurality of outputs from arbitrary stages of the plurality of delay elements constituting the delay generating section to supply the source clock and the plurality of outputs to the input of the first logic gate; and a setting circuit selecting a plurality of outputs from arbitrary stages of the plurality of delay elements constituting the delay generating section to supply the source clock and the plurality of outputs to the input of the second logic gate.

In the semiconductor equipment of the present invention, the duty changing circuit includes a setting circuit changing a switching level of an inverter circuit to the input of which the source clock is supplied, wherein the system clock is outputted from the output side of the inverter circuit.

In the semiconductor equipment of the present invention, the inverter circuit is constituted of a P channel transistor and an N channel transistor, wherein a source clock is supplied to the gates of the P channel transistor and the N channel transistor, the source of the P channel transistor is connected to a power supply voltage, the source of the N channel transistor is grounded, the drains of the P channel transistor and the N channel transistor are connected to each other; and the setting circuit is configured so as to be able to set a combination of on states and off states of a plurality of transistors connected in parallel between the drain of the P channel transistor and the N channel transistor and the ground or between the drain of the P channel transistor and the N channel transistor and the power supply voltage.

In the semiconductor equipment of the present invention, the inverter circuit is constituted of a P channel transistor and an N channel transistor, wherein a source clock is supplied to the gates of the P channel transistor and the N channel transistor, the source of the P channel transistor is connected to a power supply voltage, the source of the N channel transistor is grounded, the drains of the P channel transistor and the N channel transistor are connected to each other; and the setting circuit is configured so as to apply a duty setting signal to the gate of a transistor connected between the source of the P channel transistor and the power supply voltage or between the source of the N channel transistor and the ground, to change a switching level of the inverter circuit according to a potential of the duty setting signal and to output the system clock from the output of the inverter circuit.

A designing method for a semiconductor equipment of the present invention includes: a phase in which a current analysis in a time domain is performed based on delay information at nodes obtained from layout information and an operating frequency set arbitrarily; a phase in which a result obtained by the current analysis is converted to a frequency domain; and an identification phase identifying a frequency component in a frequency band set arbitrarily, wherein a duty ratio of a system clock is repeatedly changed to thereafter perform the current analysis and to thereby determine a duty ratio.

Another designing method for a semiconductor equipment of the present invention includes: a current analysis phase performing a current analysis in a time domain with delay information at nodes obtained from layout information; a conversion phase dividing a result obtained by the current analysis phase into a rise time and a fall time of a system clock to convert both to respective frequency domains; an arithmetic phase calculating frequency components based on phase differences between the conversion phase outputs derived from a cycle and a duty ratio of a system clock derived from an operating frequency set arbitrarily; and an identification phase identifying a frequency component in a frequency band set arbitrarily, wherein a duty ratio of the system clock is repeatedly changed to thereafter perform the arithmetic phase and to thereby determine a duty ratio.

Still another designing method for a semiconductor equipment of the present invention includes: a phase performing a current analysis in a time domain with delay information at nodes obtained from layout information; a conversion phase dividing a result obtained by the current analysis phase into a rise time and a fall time of a system clock to convert both to respective frequency domains; an arithmetic phase calculating frequency components based on a phase difference between the conversion phase outputs derived from a cycle and a duty ratio of a system clock derived from an operating frequency set arbitrarily; and an identification phase identifying a frequency component in a frequency band set arbitrarily, wherein a high period or low period of the system clock is repeatedly changed to thereafter perform the arithmetic phase to thereby determine a time difference between the high period and low period.

In the semiconductor equipment of the present invention, a time difference between the high period and low period of the system clock is a value obtained by dividing a reciprocal of a frequency region that is desirably reduced with 2.

In the semiconductor equipment of the present invention, a time difference between the high period and low period of the system clock is in the range of from 4 ns to 6 ns.

DESCRIPTION OF THE PREFERRED EMBODIMENTS

Description will be given of embodiments of the present invention below with reference to the accompanying drawings.

First Embodiment

Figure 1:
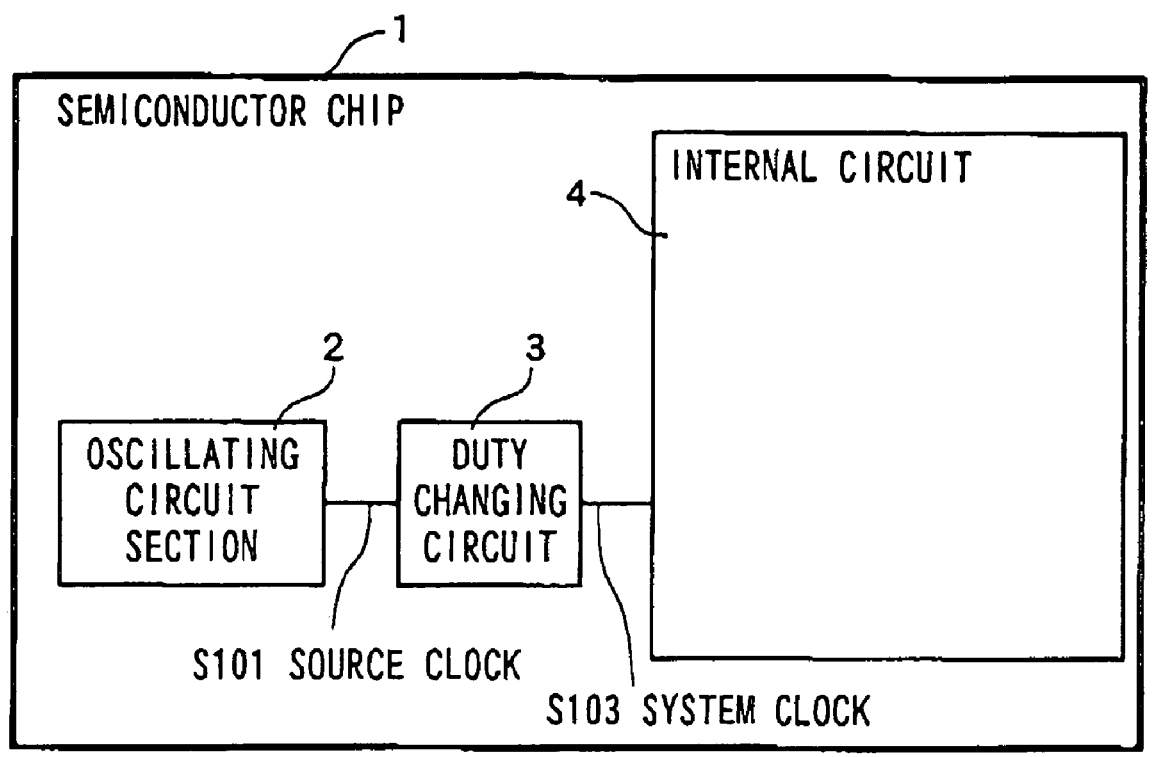
FIG. 1 is a configuration diagram of a semiconductor equipment according to a first embodiment of the present invention.
Figure 2:
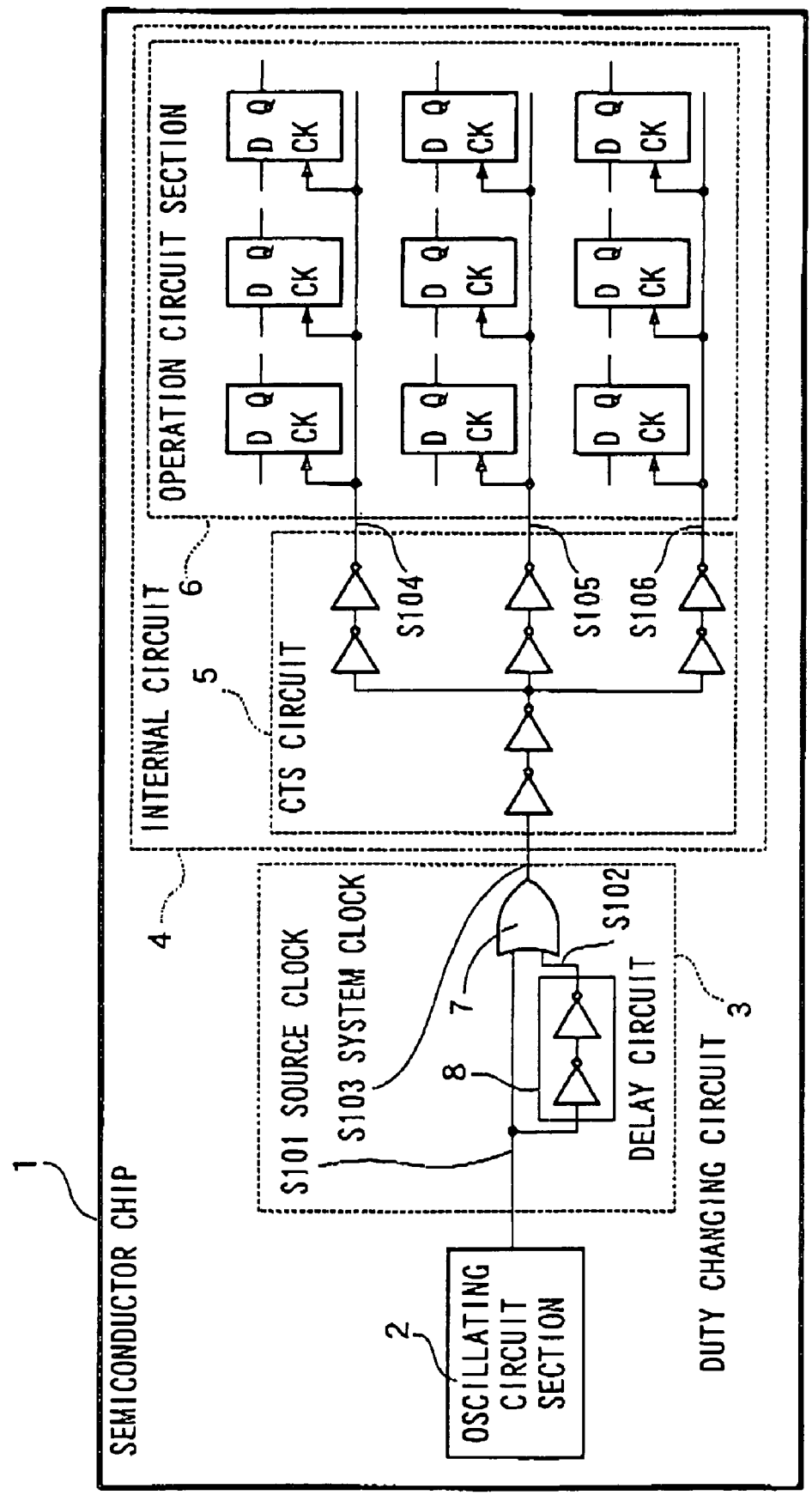
FIG. 2 is a configuration diagram of the semiconductor equipment according to the first embodiment.
Figure 19:
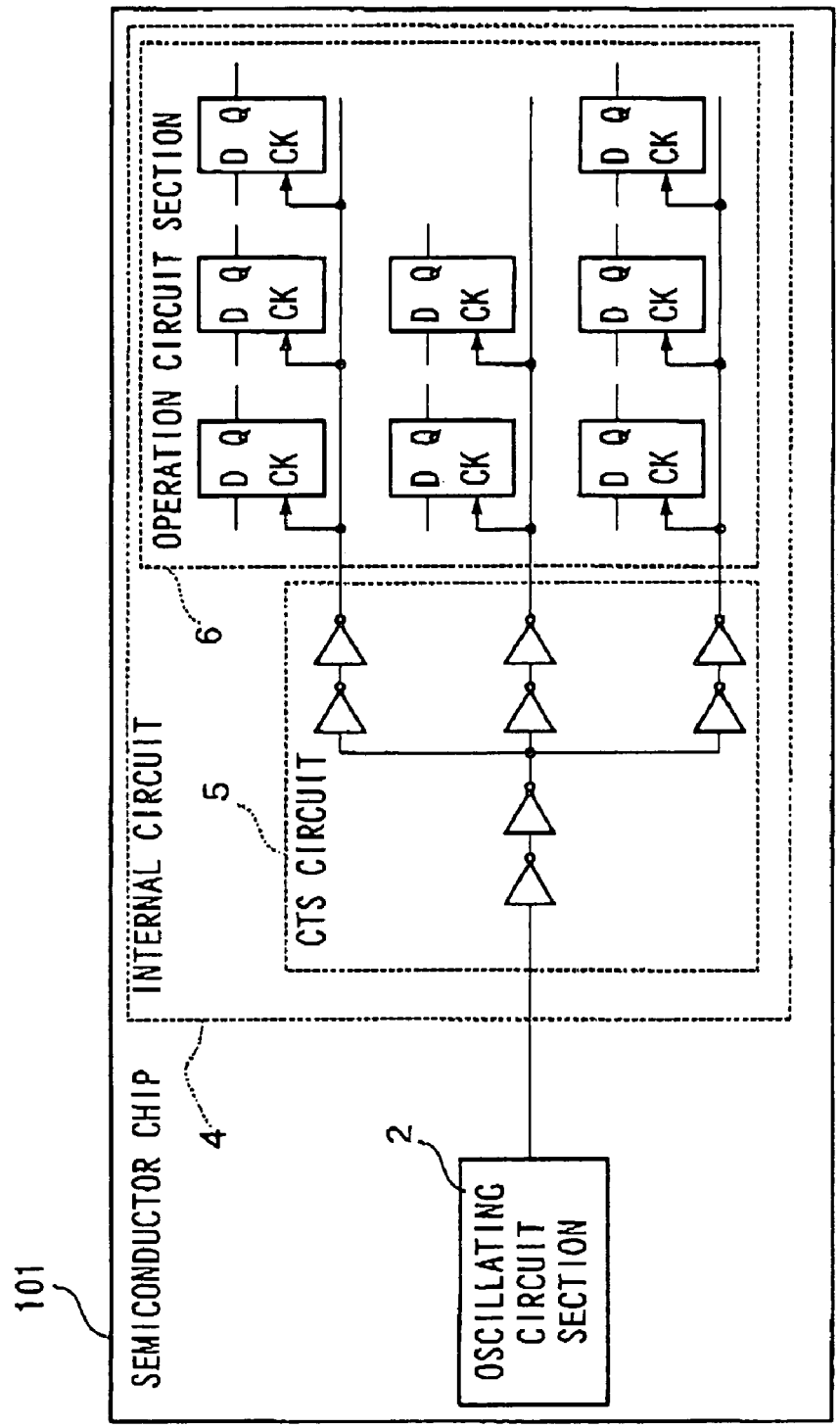
FIG. 19 is a configuration diagram of a conventional semiconductor equipment.
Figure 20:
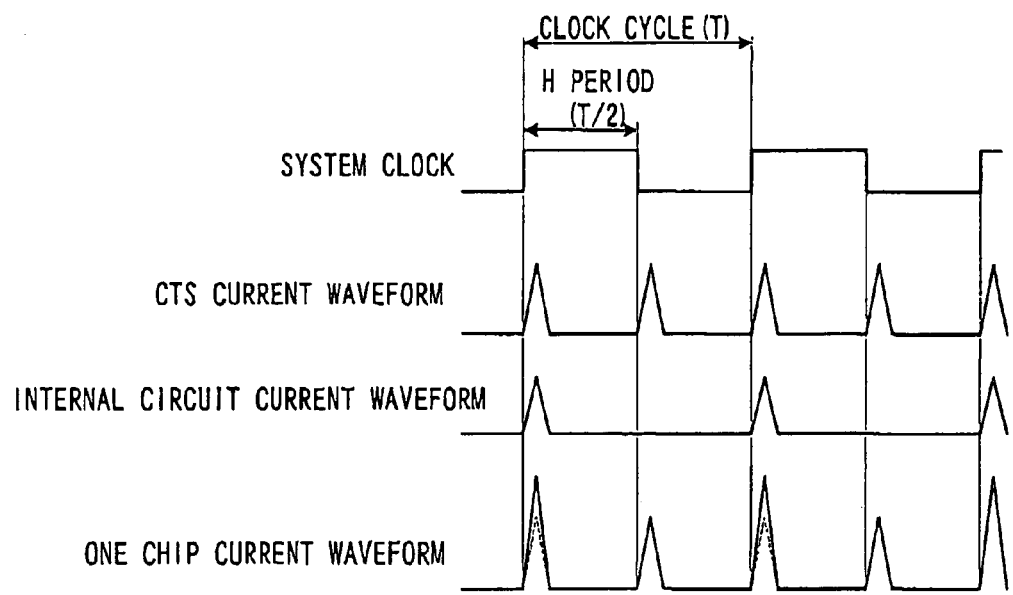
FIG. 20 is a current waveform diagram of the conventional semiconductor equipment.

FIGS. 1 and 2 show a semiconductor equipment of the first embodiment of the present invention and the semiconductor equipment is different from the conventional example shown in FIG. 19 in that a duty changing circuit 3 is inserted between the oscillating circuit section 2 and the internal circuit 4 of FIG. 19 showing the conventional semiconductor equipment. FIGS. 3 to 6 are signal waveform diagrams and current spectrum charts thereof.

In a semiconductor chip 1 as a semiconductor equipment, the duty changing circuit 3 inserted between an oscillating circuit section 2 to which an oscillator or an oscillating element is connected; and an internal circuit 4 of the semiconductor chip 1 constituted of a CTS circuit 5 to which a system clock is inputted and an operation circuit section 6 operating in synchronism with a system clock timing-adjusted and outputted from the CTS circuit 5 is, as shown in FIG. 2, constituted of a delay circuit 8 to which a source clock S101 from the oscillating circuit section 2 is distributed and inputted and a logic gate 7.

A logical sum is obtained in the logic gate 7 from the source clock S101 and a signal S102 flowing through a path through which the source clock S101 is distributed into the delay circuit 8 in the duty changing circuit 3 and the logic sum is outputted to the CTS circuit 5 as a system clock S103.

In the CTS circuit 5, the system clock S103 is compensated with respect to a timing of a signal change and outputted as clock signals S104, S105 and S105 inputted to circuit elements constituting the operation circuit section 6 at the same timing.

The circuit elements constituting the operation circuit section 6 start simultaneous signal change at leading edges of the clock signals S104, S105 and S106 outputted from the CTS circuit 5.

Figure 3:
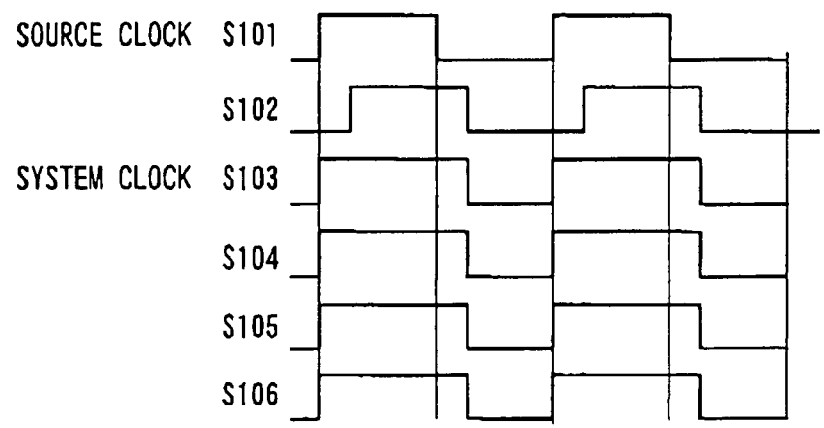
FIG. 3 is a signal waveform diagram of the semiconductor equipment according to the first embodiment.

Note that as shown in FIG. 3, since the system clock S103 is an output of a logical sum of the source clock S101 and the signal S102 flowing through a path through which the source clock is distributed into the delay circuit 8, a duty ratio thereof is different from a conventional 50%.

On the other hand, generated in transition of a signal in a CMOS circuit is a charging/discharging current required for a change in potential of a through current and on a signal line.

Therefore, in the CTS circuit 5, a current is consumed at timings of a leading edge and trailing edge of the system clock S103, while in the operation circuit section 6, a current is consumed at timings only of leading edges of the clock signals S104, S105 and S106, which are the same as the system clock S103.

Figure 4:
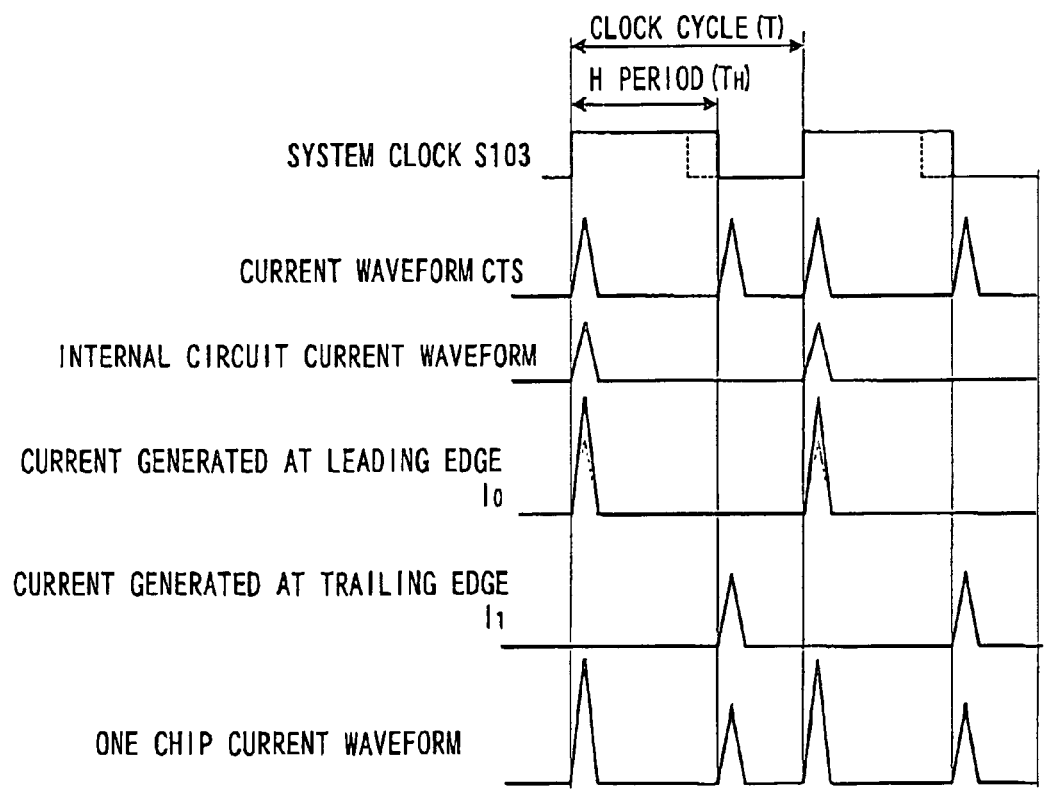
FIG. 4 is a current waveform diagram of the semiconductor equipment according to the first embodiment.
Figure 5:
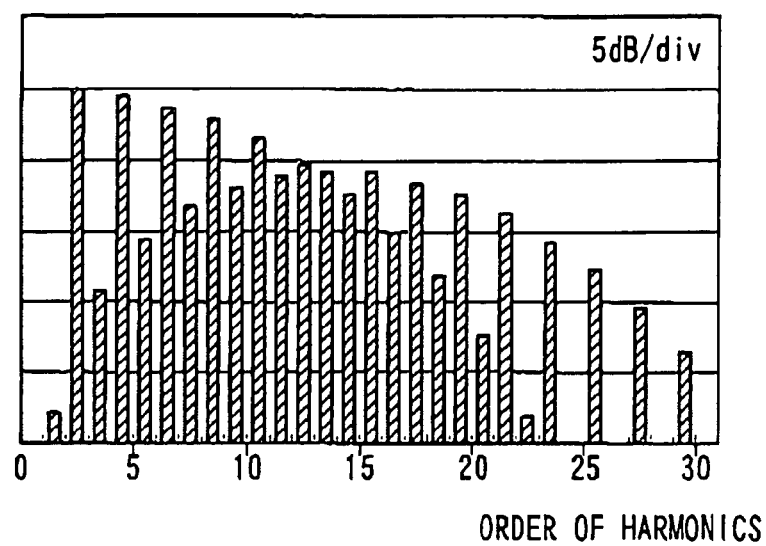
FIG. 5 is a current spectrum waveform chart of the semiconductor equipment according to the first embodiment.

Herein, current waveforms and signal spectrum waveforms in a case where a duty ratio of the system clock S103 is set to 52% are shown in FIGS. 4 and 5.

A current I(t) consumed in the semiconductor chip 1 is shown as the sum of a current I0(t) consumed at leading edges of the system clock S103 and the clock signals S104, S105 and S106 and a current I1(t) consumed at trailing edges of the system clock S103 and the clock signals S104, S105 and S106.

$$I(t) = I_0(t) + I_1(t) \quad (1)$$

Herein, since a current is generated in a cycle of the system clock S103, a transformation can be implemented as in an expression 2 using Fourier transformation.

$$I_0(t) = a_0 + \sum_{n=1}^{\infty} a_n \cos\left(2\pi n \frac{t}{T}\right) + \sum_{n=1}^{\infty} b_n \sin\left(2\pi n \frac{t}{T}\right) \quad (2)$$

-continued $$= A_0 + \sum_{n=1}^{\infty} A_n \cos\left(2\pi n \frac{t}{T}\right)$$

$$I_1(t) = B_0 + \sum_{n=1}^{\infty} B_n \cos\left(2\pi n \frac{t+T_H}{T}\right)$$

Herein, the n-th harmonic component of the system clock S103 is obtained by an expression 4 from the expression 2 and a addition theorem of trigonometric function (an expression 3).

$$A_n \cos\left(2\pi n \frac{t}{T}\right) + B_n \cos\left(2\pi n \frac{t+T_H}{T}\right) = \quad (3)$$

$$\sqrt{A_n^2 + 2A_n B_n \cos\left(2\pi n \frac{T_H}{T}\right) + B_n^2} \sin\left(2\pi n \frac{T_H}{T}\right)$$

The n-th harmonic component is obtained by the expression 4 and therefore, the 10th harmonic component in a duty ratio 50%, since T0=T/2, is obtained by the following expression.

$$\sqrt{A_n^2 + 2A_n B_n \cos\left(2\pi n \frac{T_H}{T}\right) + B_n^2} \quad (4)$$

$$\sqrt{A_{10}^2 + 2A_{10}B_{10}\cos\left(2\pi \times 10 \times \frac{T_H}{T}\right) + B_{10}^2} =$$

$$\sqrt{A_{10}^2 + 2A_{10}B_{10} + B_{10}^2} = A_{10} + B_{10}$$

The 10th harmonic component in a duty ratio 52%, since T0=0.52T, is obtained by the following expression.

$$\sqrt{A_{10}^2 + 2A_{10}B_{10}\cos\left(2\pi \times 10 \times \frac{T_H}{T}\right) + B_{10}^2} = \sqrt{A_{10}^2 + 2A_{10}B_{10}\cos(0.4\pi) + B_{10}^2}$$

$$= \sqrt{A_{10}^2 + 0.62A_{10}B_{10} + B_{10}^2}$$

In the semiconductor equipment of the first embodiment of the present invention, in this way, a duty of the system clock S103 is changed by the duty changing circuit 3 to thereby provide a phase difference between the current I0 consumed at the leading edges of the system clock S103, and the clock signals S104, S105 and S103; and the current I1 consumed at trailing edges of the system clock S103 and the clock signals S104, S105 and S106.

Figure 6:
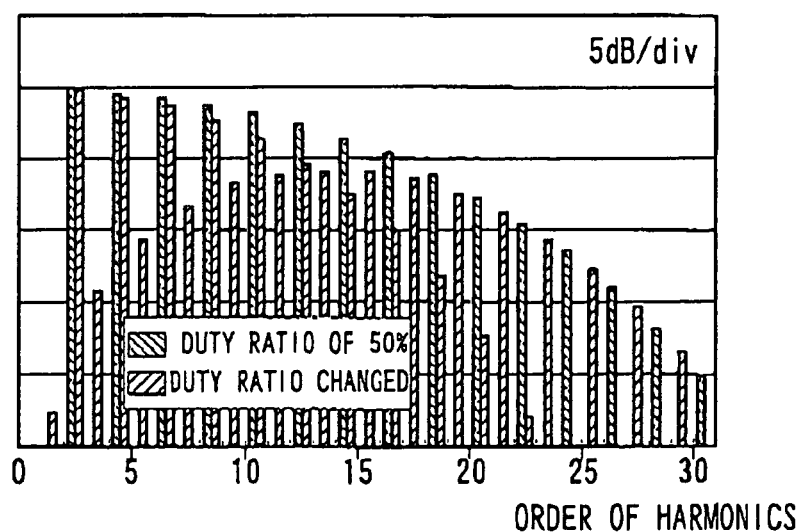
FIG. 6 is a current spectrum waveform chart of a semiconductor equipment according to a second embodiment of the present invention.
Figure 21:
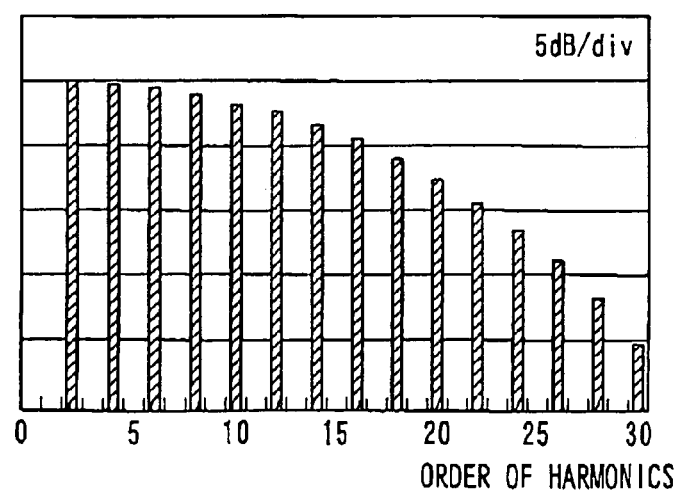
FIG. 21 is a current spectrum waveform chart of the conventional semiconductor equipment.

In FIG. 6, there is shown a comparison between the current spectrum of FIG. 21 and a current spectrum in the first embodiment in level of harmonics and it is understood that according to the first embodiment, harmonic components with frequencies of an even number order of the fundamental frequency can be reduced, thereby enabling a semiconductor equipment with less electromagnetic interference to be realized.

Note that though a logical sum is detected in the logic gate 7 in FIG. 2, a similar effect can be expected even if a logical product is detected and the logical product is used as the system clock S103.

Second Embodiment

Figure 7:
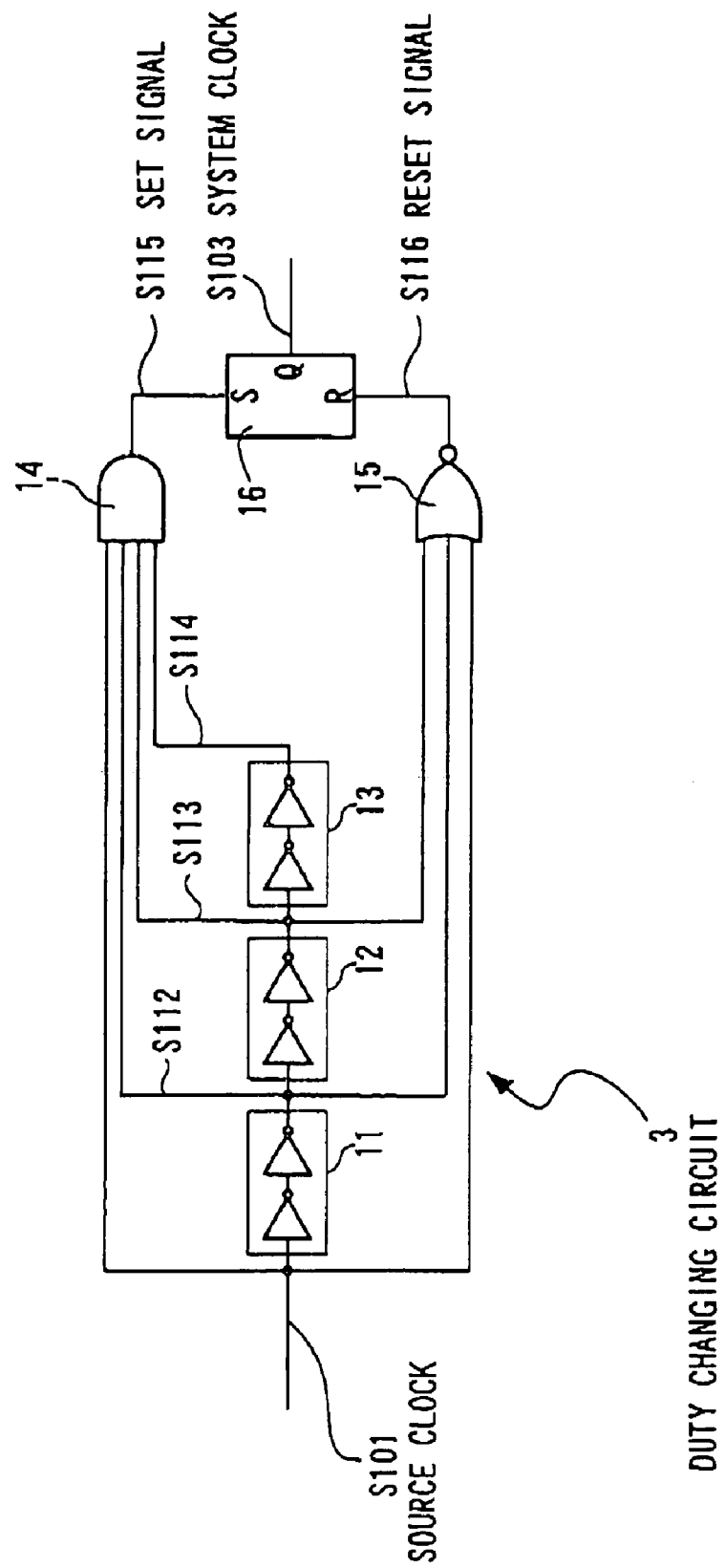
FIG. 7 is a configuration diagram of the semiconductor equipment according to the second embodiment.
Figure 8:
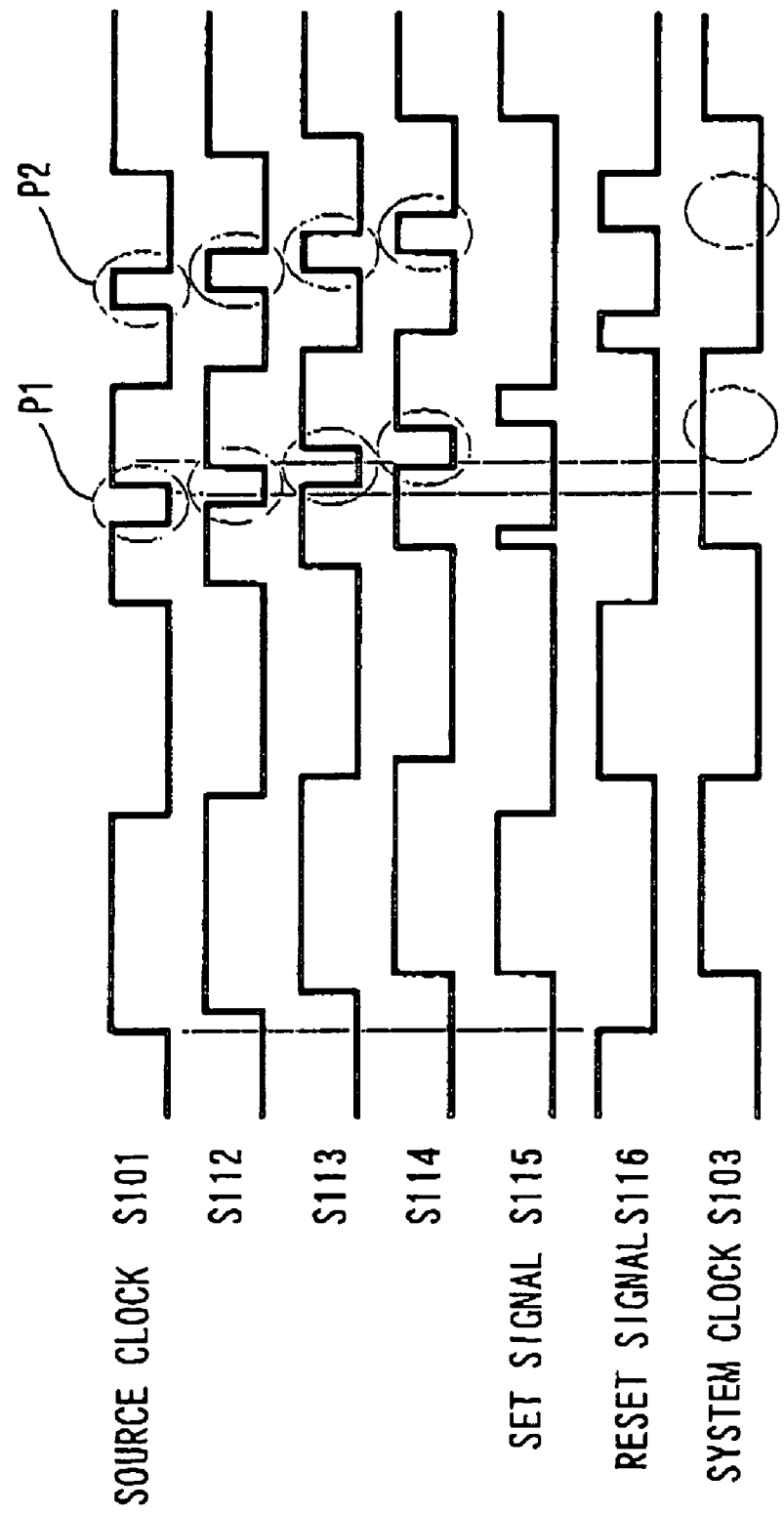
FIG. 8 is a signal waveform diagram of the semiconductor equipment according to the second embodiment.

FIGS. 7 and 8 show the second embodiment of the present invention.

FIG. 7 shows another example of the duty changing circuit 3 shown in FIG. 1 and an oscillating circuit section 2 and an internal circuit 4 of a semiconductor equipment of the second embodiment are the same as those in the first embodiment. FIG. 8 is a signal waveform diagram thereof.

In FIG. 7, numerical symbols 11, 12 and 13 are respective delay circuits connected in series to each other to constitute a delay generating section. The source clock S101 is inputted to the input of the delay circuit 11, and outputted from the connection points are signals S112, S113 and S114 each sequentially delayed from the preceding one starting with source clock S101.

A numerical symbol 14 is a 4-input AND circuit as the first logic gate and supplied to the inputs thereof are the source clock S101 and the delayed signals S112, S113 and S114. A numerical symbol 15 is a 3-input NOR circuit as the second logic gate and inputted to the inputs thereof are the source clock S101 and the delayed signals S112 and S113.

A numerical symbol 16 is a set reset type latch circuit, which changes over between output levels according to a set signal S115 from the 4-input AND circuit 14 and a reset signal S116 from the 3-input NOR circuit 15 to output the system clock S113.

Description will be given of operations in thus configured semiconductor equipment with the reference to FIG. 8.

The source clock S101 with a duty ratio of 50% generated based on a frequency of an oscillator or an oscillating unit connected to the oscillating circuit section 2 is sequentially added with a predetermined time of delay, as an increment, through the delay circuits 11, 12 and 13. Therefore, the set signal 115 is finally activated after a leading edge of the source clock S101 passes through the delay circuit 13 and a latch circuit 16 outputs a high level as the system clock S103.

To the contrary, the reset signal S116 is activated after a trailing edge of the source clock S101 passes through the delay circuit 12 and the latch circuit 16 drives the system clock S103 to a low level.

Therefore, a high level period of the system clock S103 can be shorter than a low level period thereof by a delay value of the delay circuit 13.

Then, in a case where a spike noise P1 is superimposed on the source clock S101 in a high level period thereof, a predetermined time of delay as an increment is sequentially added to the signals S112 to S114 through the delay circuits 11, 12 and 13; therefore, even if a change in clock due to the spike noise P1 causes the source clock S101 to take a low level, the reset signal S116 is not activated because of the signal S113 at the high level, and the system clock S103 is kept at the high level as is.

Thereafter, when the spike noise P1 is at length arrived at the signal S113, the source clock S101 has already been restored to the high level; therefore, it is not activated in a similar way and the system clock 103 is kept at the high level as is.

In a similar way, in a case where a spike noise P2 is superimposed on the source clock S101 in the low level period, a predetermined time of delay as an increment is sequentially added to the signals S112 to S114 through the delay circuits 11, 12 and 13; therefore, even if a change in clock due to the spike noise P2 causes the source clock S101 to take the high level, the set signal S115 is not activated because of the signal S113 at the low level and the system clock S103 is kept at the low level as is.

Thereafter, when the spike noise P1 is at length arrived at the signal S113, the source clock S101 has already been restored to the low level; therefore, it is not activated in a similar way and the system clock S103 is kept at the low level as is.

In the semiconductor equipment of the second embodiment of the present invention, in this way, generation timings of the set signal S115, and the reset signal S116 are changed by the delay circuits 11, 12 and 13 to thereby change a duty ratio of the system clock S103. In a case where the spike noises P1 and P2 are superimposed on the source clock S101 as well, the noises are absorbed to keep a duty ratio of the system clock S103 to be constant. Therefore, harmonic components with frequencies of an even number order of a power supply current can be reduced, thereby enabling a semiconductor equipment with less electromagnetic interference to be obtained.

Note that while in the second embodiment, the output signal S114 of the delay circuit 12 at the last stage is connected only to an input of the 4-input AND circuit 14 generating the set signal S115, a similar effect can be exerted even if the output signal S114 is connected only to the 3-input NOR circuit 15 generating the reset signal S116.

Third Embodiment

Figure 9:
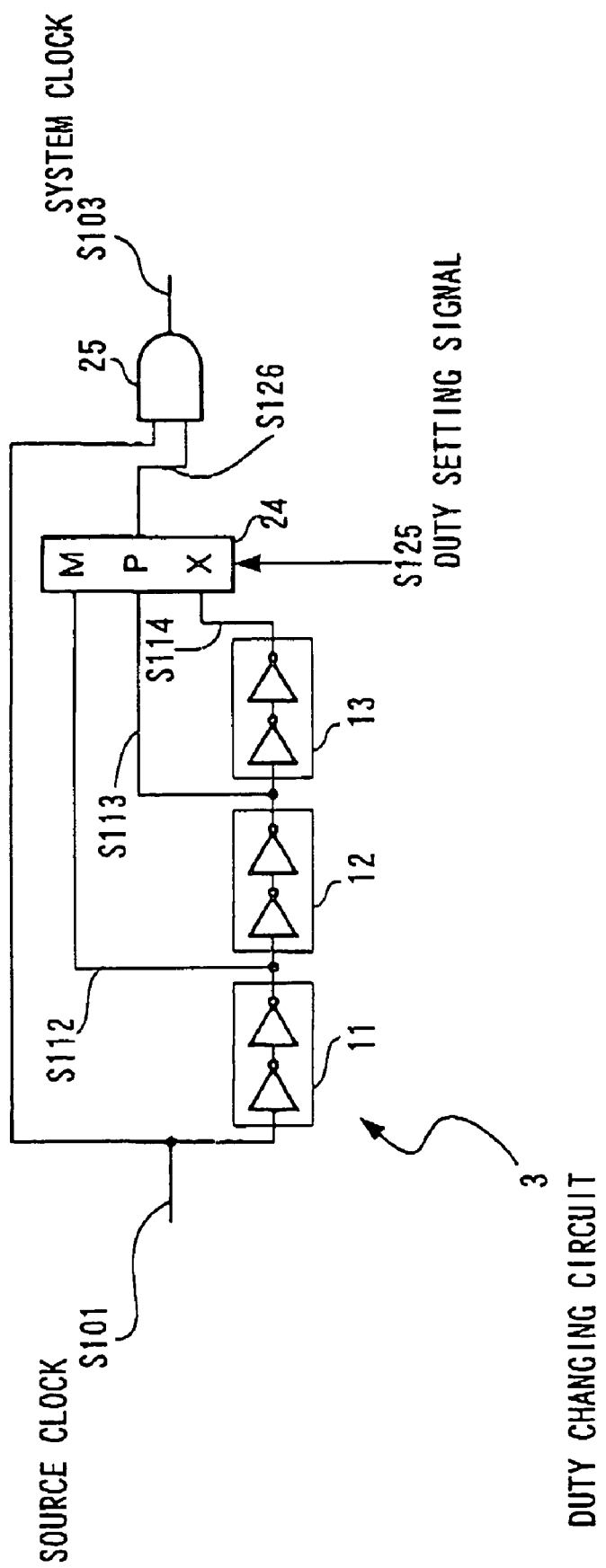
FIG. 9 is a configuration diagram of a semiconductor equipment according to a third embodiment of the present invention.

FIG. 9 shows another example of the duty changing circuit 3 shown in FIG. 2.

In FIG. 9, numerical symbols 11, 12 and 13 are delay circuits connected in series to each other into which a source clock S101 is inputted and signals S112, S113 and S114 each sequentially delayed from the preceding one stating with the source clock 121 are outputted from the respective connection points.

A numerical symbol 24 is a selection circuit selecting one of the delayed signals S112, S113 and S114 to output the selected one as an output signal S126 and it is designated which of the delayed signals is selected according to a duty setting signal S125.

An output signal S126 and the source clock S101 are supplied to the inputs of a logic gate 25 and a logical product thereof are outputted as a system clock S103.

Detailed description will be given of operations in thus configured semiconductor equipment.

The source clock S101 with a duty of 50% generated based on a frequency of an oscillator or an oscillating unit connected to an oscillating circuit section 2 is sequentially added with a predetermined time of delay as an increment through delay circuits 11, 12 and 13 and a logical product of the signal S126 selected by the selection circuit 24 and the source clock S121 is detected by a logic gate 25 and outputted as the system clock S103.

Therefore, in a case where the source clock S101 changes to a low level, the system clock S103 immediately changes to a low level, while to the contrary, in a case where the source clock S101 changes to a high level, the system clock S103 does change to the high level till a delayed signal selected by the selection circuit 24 arrives. Therefore, a high level period of the system clock S103 can be shorter than a low level period thereof by a delay value selected in the selection circuit 24.

In the semiconductor equipment of the third embodiment of the present invention, outputs of the delay circuits 11, 12 and 13 are selected by the selection circuit 24 to thereby change a duty ratio of the system clock S103. Therefore, there can be obtained a semiconductor equipment that, with setting values in a setting circuit, harmonics are effectively reduced in a target frequency band required for a commercial product in which the semiconductor equipment is mounted.

Fourth Embodiment

Figure 10:
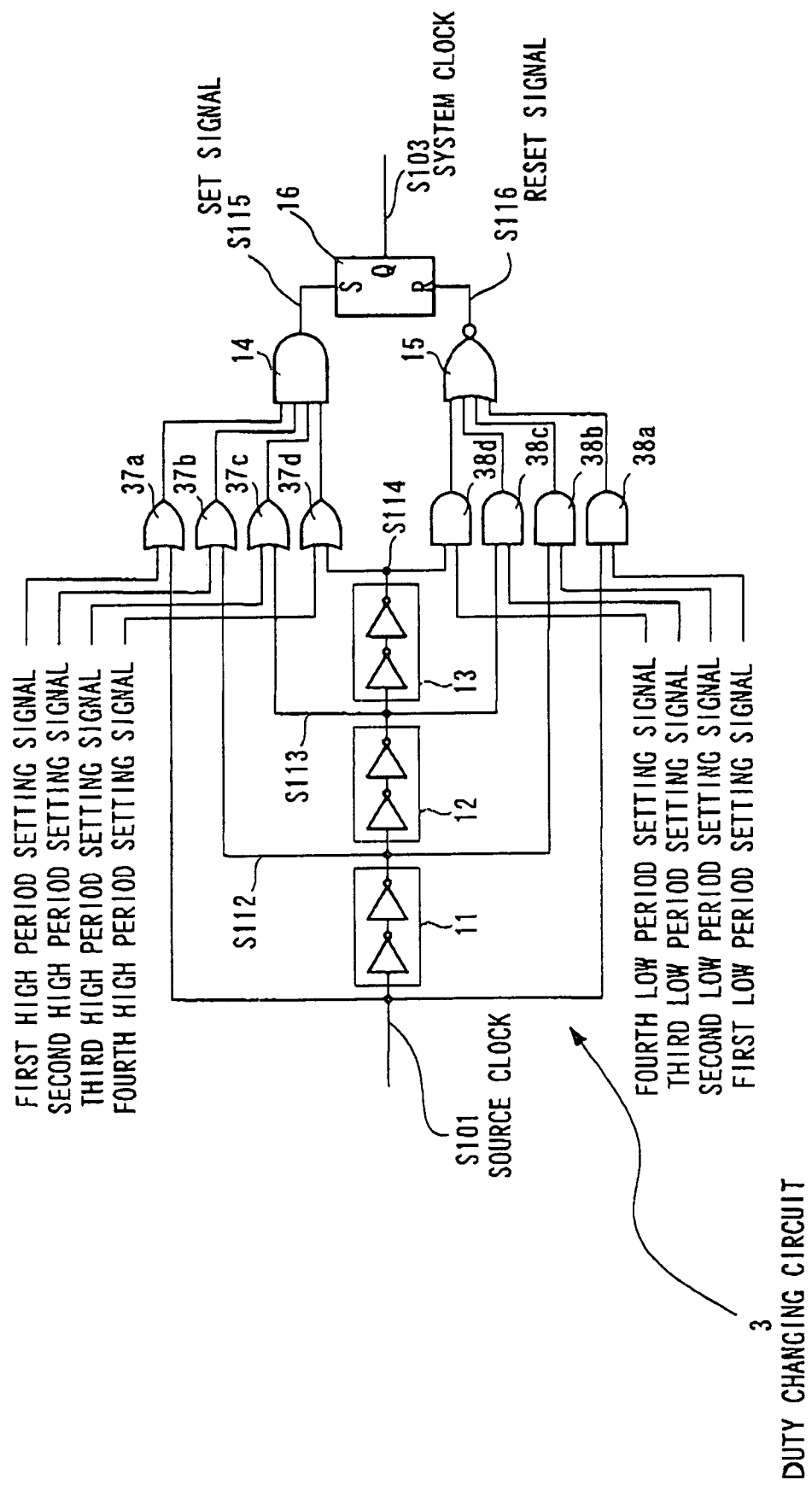
FIG. 10 is a configuration diagram of a semiconductor equipment according to a fourth embodiment of the present invention.

FIG. 10 shows another example of the duty changing circuit 3 shown in FIG. 1 and an oscillating circuit section 2 and an internal circuit 4 of the third embodiment are the same as those of the first embodiment.

While in the third embodiment, the system clock S103 is generated in the logic gate 25, a similar effect can be obtained in a configuration in which, as shown in FIG. 10, outputs of delay circuits are selected, the selected outputs are a logical sum gate and a logical product gate to generate a set signal and a reset signal and the signals are used to change a system clock, which is an output signal of a latch circuit, furthermore, enabling a semiconductor equipment capable of eliminating a noise component superimposed on the source clock signal to be obtained.

To be concrete, signals are supplied to the inputs of a 4-input AND circuit 14 as the first logic gate shown in FIG. 7 through OR gates 37*a* to 37*d* and signals are supplied to the inputs of a 3-input NOR circuit 15 as the second logic gate through AND gates 38*a* to 38*d*.

A source clock S101, delayed signals S112, S113 and S114 are connected to one inputs of the OR gates 37*a* to 37*d*, while setting signals for the first to fourth high periods are connected to the other inputs of the OR gates 37*a* to 37*d*, in which configuration input signals of the 4-input AND circuit 14 are changed over according to the setting signals for the first to fourth high periods.

The source clock S101 and the delayed signal S112, S113 and S114 are connected to one inputs of the AND gates 38*a* to 38*d*, while setting signals for the first to fourth low periods are connected to the other inputs of the AND gates 38*a* to 38*d*, in which configuration input signals of the 3-input NOR circuit 15 are changed over according to the setting signals for the first to fourth low periods.

In such a way, a duty can be changed with a difference in delay amount between a signal with the most delay amount among the signals, outputted from the delay circuits 11, 12 and 13 as the delay generating section, selected by the OR gates 37*a* to 37*d* as the setting circuit, and then inputted to the 4-input AND circuit 14 as the first logic gate; and a signal with the most delay amount among the signals, outputted from the delay circuits 11, 12 and 13, selected by the AND gates 38*a* to 38*d* as the setting circuit, and then inputted to the 3-input OR circuit 15 as the second logic gate as a difference between a high period and low period of the system clock.

Fifth Embodiment

Figure 11:
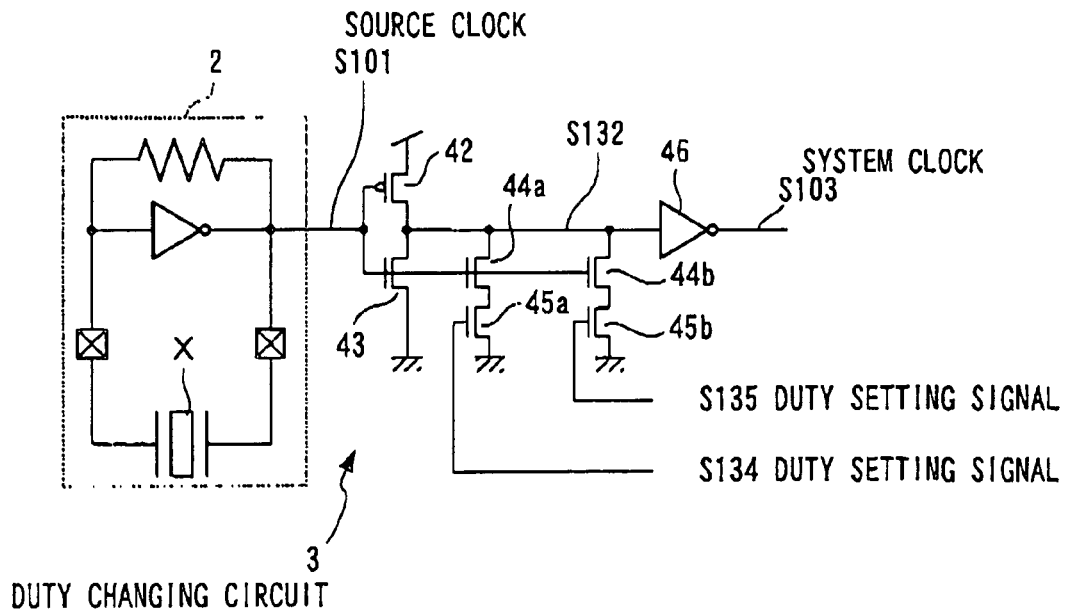
FIG. 11 is a configuration diagram of a semiconductor equipment according to a fifth embodiment of the present invention.
Figure 12:
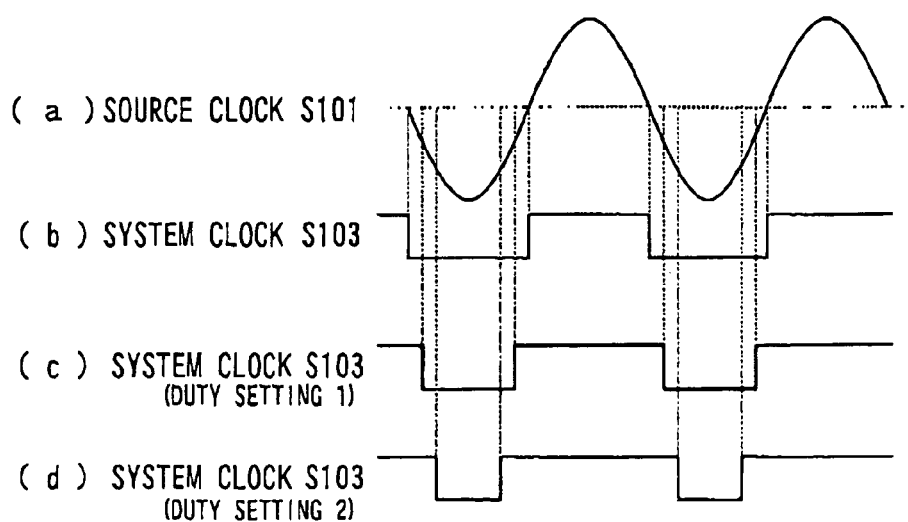
FIG. 12 is a signal waveform diagram of the semiconductor equipment according to the fifth embodiment.

FIGS. 11 and 12 show the fifth embodiment of the present invention.

FIG. 11 shows a concrete circuit of the oscillating circuit section 2 and another example of the duty changing circuit 3 shown in FIG. 1 and an internal circuit 4 is the same as that in the first embodiment. FIG. 12 is a signal waveform diagram thereof.

In FIG. 11, a source clock S101 is supplied to the gates of a P channel transistor 42 and an N channel transistor 43. The source the P channel transistor 42 is connected to the power supply voltage and the source of the N channel transistor 43 is grounded. The drains of the P channel transistor 42 and the N channel transistor 43 are connected to each other. A serial circuit of N channel transistors 44a and 45a and a serial circuit of N channel transistors 44b and 45b are provided in parallel between the drain of the P channel transistor 42 and N channel transistor 43 and the ground; and the source clock S101 is supplied to the gates of N channel transistors 44a and 44b.

A signal S132 on the drain of the P channel transistor 42 and N channel transistor 43 is outputted as a system clock S103 through a logic gate 46 for waveform shaping.

Description will be given of operations in a state where the N channel transistors 45a and 45b are turned off by duty setting signals S134 and S135 with reference to FIG. 12.

An oscillating circuit section 2, as shown in FIG. 12(a), outputs the source clock S101 generated in the waveform close to a sine wave based on a frequency of an oscillating unit X.

In this situation, since the N channel transistors 45a and 45b are turned off, no current flows in the N channel transistors 44a and 44b regardless of a level of the source clock S101. Therefore, a signal level of the signal S132 is determined by a transistor's ability of the P channel transistor 42 and a transistor's ability of the N channel transistor 43, and the system clock S103 with a duty ratio 50% shown in FIG. 12(b) is outputted through the logic gate 46.

Then, description will be given of operations in a case where the N channel transistor 45a is turned on and the N channel transistor 45b is turned off by the duty setting signals s134 and S135.

Since the N channel transistor 45b is turned off, no current flows in the N channel transistor 44b regardless of a level of the source clock S101. According to a level of the source clock S101, however, there arises a case where a path through the N channel transistors 44a and 45a is added as a current path to the ground side. Therefore, since a switching level is reduced and the signal S132 has a period at a low level period longer than in a case where the N channel transistors 45a and 45b are both turned off, the system clock S103 after passing through the logic gate 46 is, as shown in FIG. 12(c), outputted with a high period longer than the system clock S103 with a duty ratio of 50% shown in FIG. 12(b).

In a case where the N channel transistors 45a and 45b are both turned on by the duty setting signals S134 and S135, a switching level is further reduced and the signal S132 has a period at a low level further longer than in a case where the N channel transistor 45a is turned on and the N channel transistor 45b is turned off, the system clock S103 after passing through the logic gate 46 is, as shown in FIG. 12(d), outputted with a high period further longer in duty than the system clock S103 shown in FIG. 12(c).

In the semiconductor equipment using the duty changing circuit 3 of the fifth embodiment of the present invention, in this way, a duty ratio of the system clock S103 can be changed by changing setting of a switching level of an inverter circuit constituted of the P channel transistor 42 and the N channel transistor 43 by the duty setting signals S134 and S135; therefore, there can be easily obtained a semiconductor equipment in which, with setting values in setting circuits of the duty setting signals S134 and S134, harmonics are reduced in a target frequency band required for a commercial product in which the semiconductor equipment is mounted, without resulting in scale-up in the circuit.

Note that while in the above described fifth embodiment, the duty setting signals S134 and S135 are inputted to the side of the N channel transistor 43, a similar effect can be obtained in a case where the duty setting signals S134 and S135 are inputted to the side of the P channel transistor 42.

Sixth Embodiment

Figure 13:
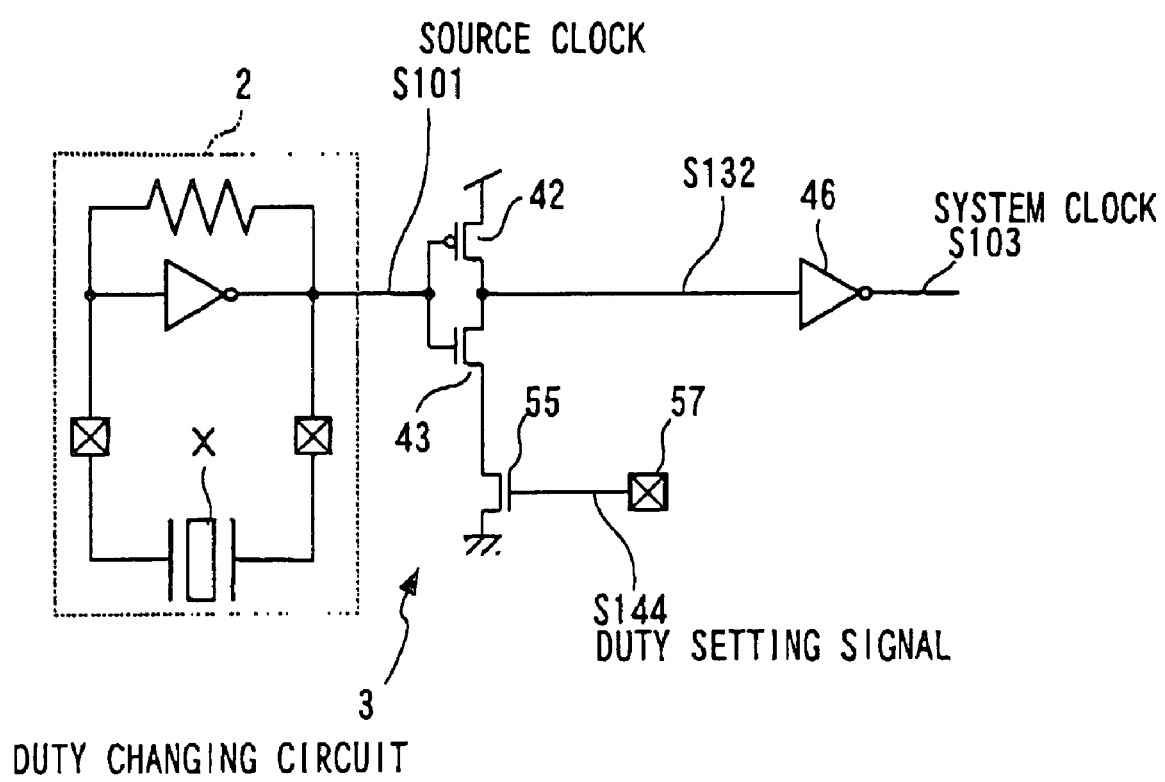
FIG. 13 is a configuration diagram of a semiconductor equipment according to a sixth embodiment of the present invention.

FIG. 13 shows the sixth embodiment of the present invention.

FIG. 13 shows a concrete circuit of the oscillating circuit 2 and another example of the duty changing circuit 3 shown in FIG. 1 and an internal circuit 4 is the same as that in the first embodiment. In the fifth embodiment, the configuration is adopted in which the transistors 44a, 45a, 44b and 45b constituting the setting circuit are in parallel inserted between the drain of the P channel transistor 42 and the N channel transistor 43 and the ground so as to enable a combination of turning-on states and turning-off states of the plurality of transistors to be set, while in the sixth embodiment, the configuration is different from the fifth embodiment only in that a transistor 55 is connected in series to and outside transistors 42 ad 43 constituting an inverter circuit.

Description will be given of operations in thus configured semiconductor equipment.

In this semiconductor equipment, a switching level of the inverter circuit is set according to an analog level of a duty setting signal S144 supplied to a duty setting terminal 57.

To be concrete, with a higher potential of the duty setting signal S144, a switching level of the inverter circuit constituted of a P channel transistor 52 and N channel transistors 53 and 55 is lowered, while to the contrary, with a lower potential of the duty setting signal S144, a switching level of the inverter circuit is raised.

The duty ratio of a system clock S103 is changed in such a way. Therefor, a duty ratio can be steplessly changed according to an input level of an external terminal. The change can also be easy to be done after mounting the equipment on a printed board.

Therefore, a potential of the duty setting signal S144 is set so that harmonics are reduced in a target frequency band of a commercial product in which a semiconductor equipment is mounted.

Note that in the sixth embodiment, a duty is set inserting the transistor 55 on the side of the N channel transistor 53, while a configuration can also be adopted in which a duty is set inserting a transistor between the P channel transistor 42 and the power supply voltage in a similar way.

Seventh Embodiment

This embodiment is directed to a designing method capable of determining an optimal duty of a system clock S103 in the semiconductor equipment in each of the embodiments and includes: a phase in which a current analysis in a time domain is performed based on delay information at nodes obtained from layout information and signal transition information at the nodes obtained by a logic simulation with an operating frequency set arbitrarily; a phase in which a result obtained by the current analysis is converted to a frequency domain; and an identification phase identifying a frequency component in a frequency band set arbitrarily; and a phase repeatedly changing a duty ratio of a system clock to thereafter perform a logic simulation and to thereby determine the best duty ratio.

Figure 14:
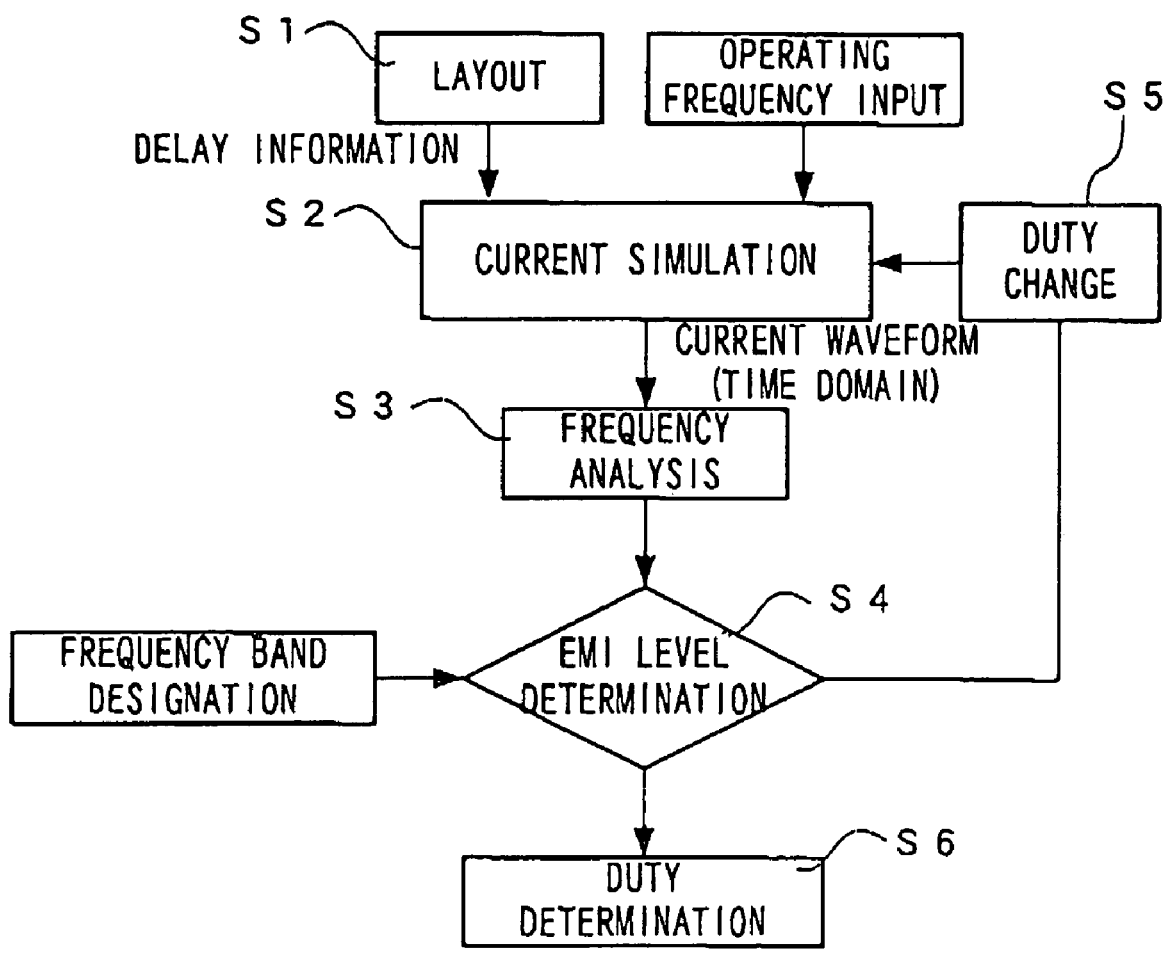
FIG. 14 is a flowchart showing steps of a semiconductor equipment designing method according to a seventh embodiment of the present invention.

To be concrete, at a stage where layout design ends, as shown in FIG. 14, values of resistance and capacitance of wiring are extracted using LPE or various kinds of design tools with the result that delay information at the nodes can be obtained (step S1).

Then, the delay information at the nodes are reflected and actual delay simulation at an operating frequency set arbitrarily is done and as a result thereof, a change in current is obtained (step S2).

A result obtained by a current analysis is converted to a frequency domain with an FFT analysis method (step S3). A frequency component obtained here is identified in a frequency band set arbitrarily (step S4), a duty ratio of the system clock is changed (step S5) and thereafter, an actual delay simulation is again done and then, a change in current is obtained based on a result of the simulation.

Then, the result obtained by the current analysis is again converted to a frequency domain with the FFT analysis method to identify a frequency component.

The series of operations described above are repeated to thereby determine the best duty ratio (step S6).

As is also clear from the above description, in the semiconductor equipment of the seventh embodiment of the present invention, an effect is easily predicted in a design flow using a computer flow thereby to obtain a semiconductor equipment in which harmonics are effectively eliminated in a target frequency band for a commercial product in which the semiconductor equipment is mounted.

Eighth Embodiment

This embodiment is directed to a designing method capable of determining a duty of a optimal system clock S103 in the semiconductor equipment in each of the embodiments and includes: a phase performing a current analysis in a time domain both at a rise time and fall time of a system clock with delay information at nodes obtained from layout information and signal transition information at the nodes when the system clock is transitioned obtained in a logic simulation; a conversion phase dividing results obtained by the current analysis to convert to frequency domains; an arithmetic phase calculating frequency components based on phase differences between the conversion phase outputs derived from a cycle and a duty ratio of the system clock derived from an operating frequency set arbitrarily; and an identification phase identifying a frequency component in a frequency band set arbitrarily; and a phase repeatedly changing a duty ratio of the system clock to perform the arithmetic phase and to thereby determine the best duty ratio.

Figure 15:
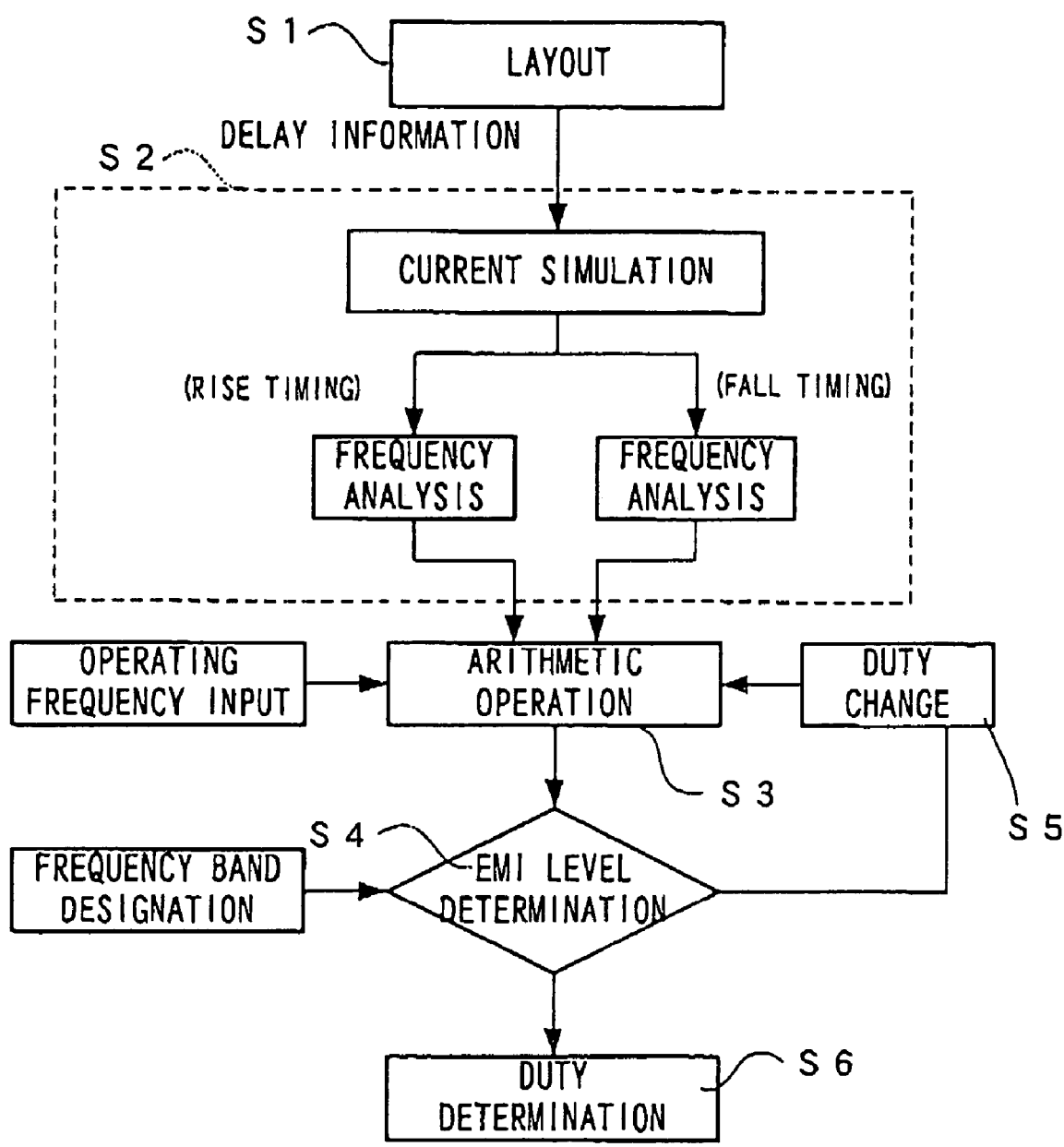
FIG. 15 is a flowchart showing steps of a semiconductor equipment designing method according to an eighth embodiment of the present invention.

To be concrete, at a stage where layout design ends, as shown in FIG. 15, values of resistance and capacitance of wiring are extracted using LPE or various kinds of design tools with the result that delay information at the nodes can be obtained (step S1).

Then, with the delay information at the nodes reflected, there are performed actual delay simulation at an operating frequency having a light load on a computer, and from a result thereof, a change in current is obtained separately at a rise time of a system clock and a fall time thereof (step S2).

A result obtained by a current analysis is converted to a frequency domain with an FFT analysis method (step S3).

An arithmetic is performed based on a frequency component obtained here in consideration of a duty ratio and a phase difference, and the frequency component is identified in a frequency band set arbitrarily (step S4), a duty ratio of the system clock is changed (step S5) and thereafter, an arithmetic is again performed to then, identify the frequency component.

A series of the operations described above are repeated to thereby determine the best duty ratio (step S6).

As is also clear from the above description, in the semiconductor equipment of the eighth embodiment of the present invention, since the current analysis and the conversion phase both requiring a time in calculation are only twice for each step performed separately at a rise time of the system clock and a fall time thereof, the best duty ratio can be calculated at high speed without imposing a load on a computer, thereby enabling a semiconductor equipment in which harmonics can be effectively eliminated in a target frequency band for a commercial product in which the semiconductor equipment is mounted to be obtained.

Ninth Embodiment

Figure 16:
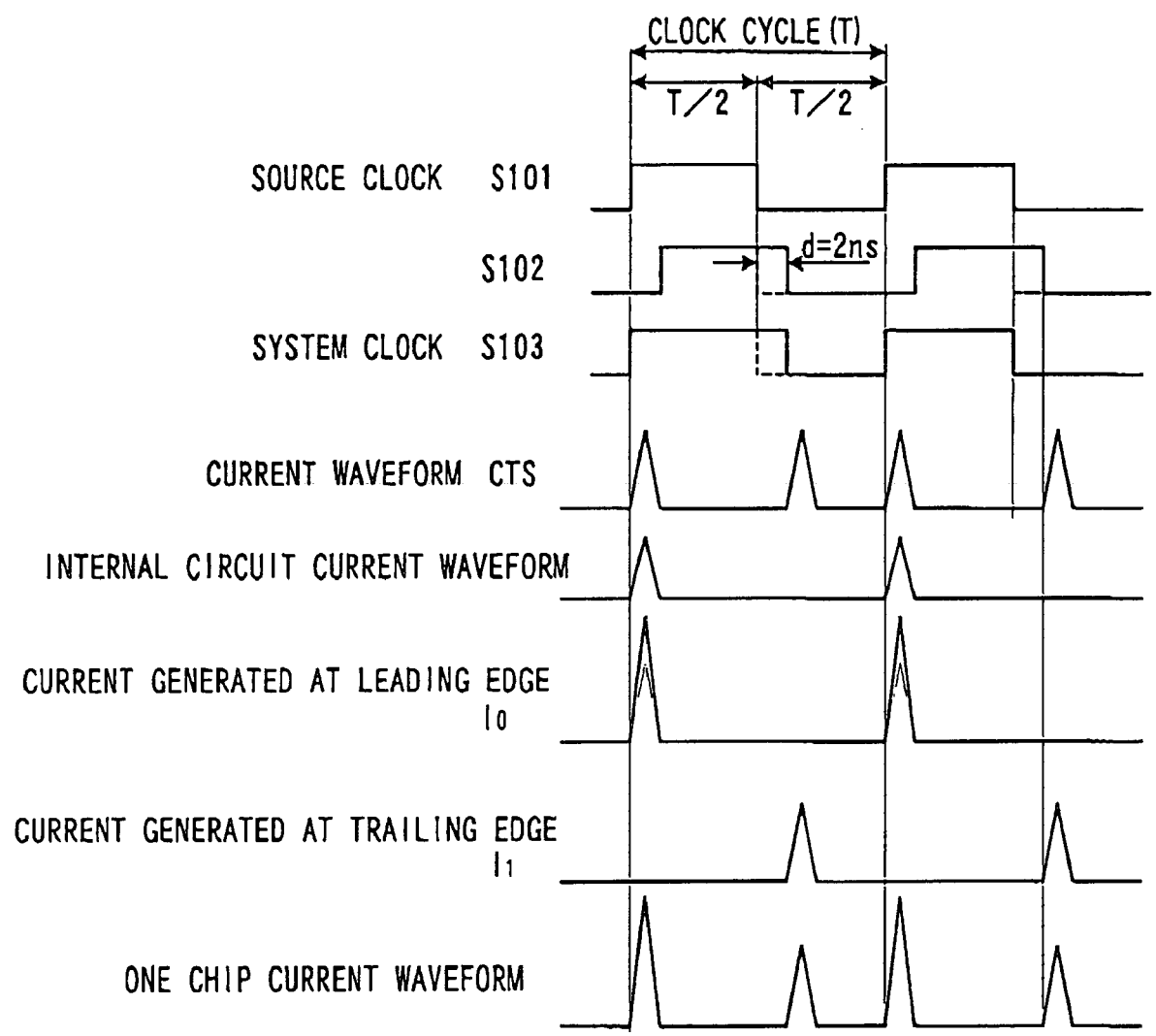
FIG. 16 is a signal waveform diagram of a semiconductor equipment according to a ninth embodiment of the present invention.
Figure 17:
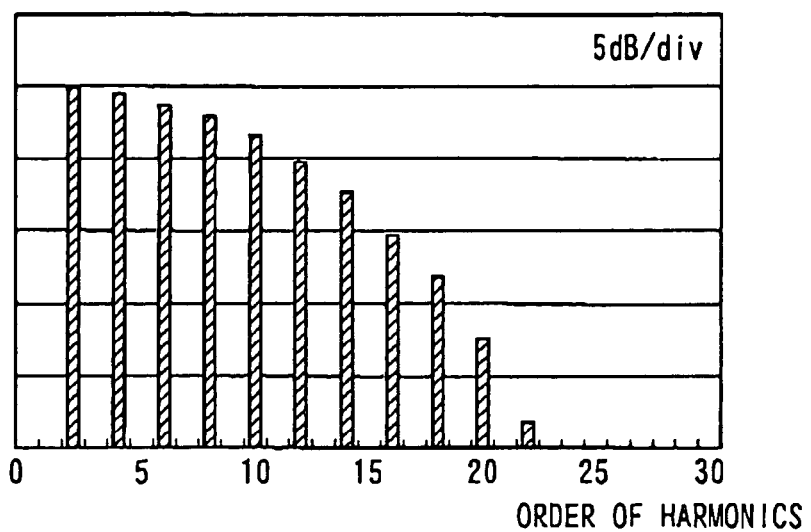
FIG. 17 is a current spectrum waveform chart of the semiconductor equipment pertaining to the ninth embodiment.
Figure 18:
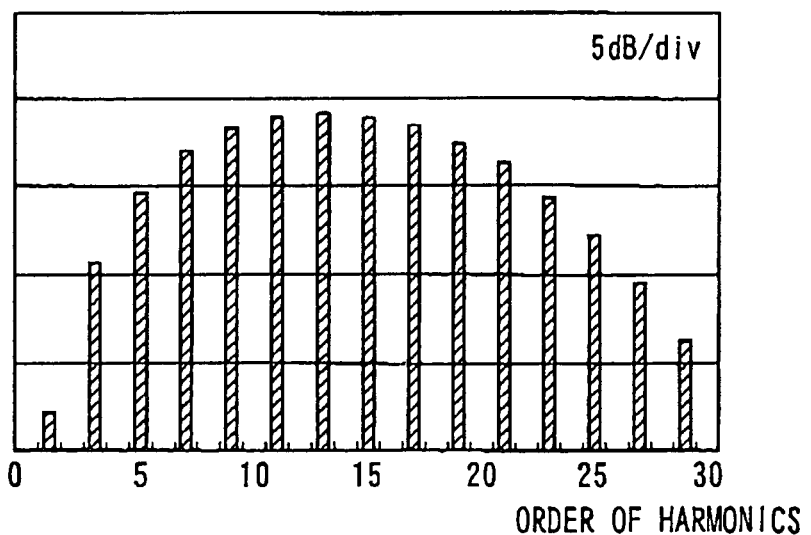
FIG. 18 is a current spectrum waveform chart of the semiconductor equipment according to the ninth embodiment.

FIGS. 16 to 18 show a concrete example describing a way how a delay value d of a delay circuit 8 is calculated in the semiconductor equipment of the first embodiment shown in FIG. 2.

A source clock S101 generated based on a frequency of an oscillator or an oscillating unit connected to an oscillating circuit 2 is subjected to an operation of a logical sum in a logic gate 7 with a signal S102 delayed by the delay circuit 8 in a duty changing circuit 3 and the logical sum is outputted to a CTS circuit 5 as a system clock S103.

In the CTS circuit 5, the system clock S103 is compensated on timing after signal change and outputted as clock signals S104, S105 and S106 to be inputted at the same timing to circuit elements constituting an operation circuit section 6.

The circuit elements constituting the operation circuit section 6 start simultaneous signal change at leading edges of the clock signals S104, S105 and S106 outputted from the CTS circuit 5.

On the other hand, in transition of a signal in a CMOS circuit, there is generated a charging/discharging current required for a change in potential of a through current and on a signal line.

Therefore, in the CTS circuit 5, a current is consumed at a leading edge and trailing edge of the system clock S103 and in the operation circuit section 6, a current is consumed only at timings of leading edges of the clock signals S104, S105 and S106 with the same timing as the system clock S103.

A current I(t) consumed in the semiconductor chip 1 is indicated by the sum of a current I0(t) consumed at leading edges of the system clock 103 and the clock signals S104, S105 and S106, and a current I1(t) consumed at falling edges of the system clock S103 and the clock signals S104, S105 and S106.

$$I(t) = I_0(t) + I_1(t) \quad (1)$$

Herein, since a current is generated in a cycle of the system clock S103, a transformation can be implemented as in the expression 2' using Fourier transformation.

$$I_0(t) = a_0 + \sum_{n=1}^{\infty} a_n \cos\left(2\pi n \frac{t}{T}\right) + \sum_{n=1}^{\infty} b_n \sin\left(2\pi n \frac{t}{T}\right) \quad (2')$$

$$= A_0 + \sum_{n=1}^{\infty} A_n \cos\left(2\pi n \frac{t}{T}\right)$$

$$I_1(t) = B_0 + \sum_{n=1}^{\infty} B_n \cos\left(2\pi n \frac{t + \frac{T}{2} + d}{T}\right)$$

Herein, the n-th harmonic component of the power supply current is obtained by the expression 4 derived from the expression 2 and a addition theorem of trigonometric function (the expression 3).

$$C_n \sin\left(2\pi n \frac{t}{T} + \alpha\right) = A_n \cos\left(2\pi \frac{t}{T}\right) + B_n \cos\left(2\pi \frac{t + \frac{T}{2} + d}{T}\right)$$

$$= \sqrt{A_n^2 + 2A_n B_n \cos\left(2\pi n \frac{\frac{T}{2} + d}{T}\right) + B_n^2 \sin\left(2\pi \frac{t}{T} + \alpha\right)}$$

(3')

The n-th harmonics is expressed by the following expression.

$$C_n = \sqrt{A_n^2 + 2A_n B_n \cos\left(2\pi n \frac{\frac{T}{2} + d}{T}\right) + B_n^2}$$

$$= \sqrt{A_n^2 + 2A_n B_n \cos\left(\pi n + 2\pi n \frac{d}{T}\right) + B_n^2}$$

(4')

Herein, a harmonic component with a frequency of an even number order (n=2m) and a harmonic component with a frequency an odd number order (n=2m+1) are given by an expression 5 and an expression 6, respectively, since herein, $COS(2\pi+\beta)=COS(\beta)$ and $COS(\pi+\beta)=-COS(\beta)$.

$$C_{2m} = \sqrt{A_n^2 + 2A_n B_n \cos\left(2\pi n \frac{d}{T}\right) + B_n^2}$$

(5)

$$C_{2m+1} = \sqrt{A_n^2 - 2A_n B_n \cos\left(2\pi n \frac{d}{T}\right) + B_n^2}$$

(6)

FIGS. 17 and 18 are current spectrum waveform charts of harmonic components each with a frequency of an odd number order and harmonic components each with a frequency of an odd number order. A duty ratio of the system clock S103 is changed to thereby accelerate attenuation of harmonic components each with a frequency of an even number order, whereas with an increase of the even number order, harmonic components each with a frequency of an odd number order increases to the contrary.

Electromagnetic interference, generally, becomes problematic at the maximum value in a frequency band with some width. Therefore, if frequency components each with a frequency of an even number order and frequency components each with an odd number order are equal, an effect of reducing harmonics due to a change in duty ratio of the system clock S103 is maximized.

If a target frequency band is defined as fa, the order of harmonics to be reduced may be obtained by an expression 7.

$$n = \frac{f_a}{1/T} = f_a \cdot T$$

(7)

Therefore, in the frequency band fa, a delay value d, at which frequency components each with a frequency of an even number order and frequency components each with a frequency of an odd number order are equal, may be obtained by the following expression.

$$C_{2m} = C_{2m}$$

$$= \sqrt{A_n^2 + 2A_n B_n \cos\left(2\pi n \frac{d}{T}\right) + B_n^2}$$

$$= \sqrt{A_n^2 - 2A_n B_n \cos\left(2\pi n \frac{d}{T}\right) + B_n^2}$$

$$\therefore \cos\left(2\pi n \frac{d}{T}\right) = -\cos\left(2\pi \frac{d}{T}\right)$$

$$= 0$$

The following expression is given from the above expression and the expression 7.

$$\cos\left(2\pi n \frac{d}{T}\right) = \cos\left(2\pi \cdot f_a \cdot T \cdot \frac{d}{T}\right) = \cos(2\pi \cdot f_a \cdot d) = 0$$

Therefore, $2\pi \cdot f_a \cdot d = (\pi/2)$.

$$\therefore d = (1/4 f_a)$$

(8)

In a system such as audio or the like, frequency components in the FM radio band (from the lower limit frequency 70 MHz to the upper limit frequency 120 MHz) becomes problematic with ease. Therefore, in the equation 8, fa=70 MHz to 120 MHz is substituted thereinto to thereby calculate a delay valued of the delay circuit 8 as optimal values of 2 ns to 3 ns. Since a difference between a high period and low period of the system clock S103 is twice as large as a delay value d, an optimal difference is calculated to be most preferably in the range of from 4 ns to 6 ns.

As is clear from the above description as well, in the semiconductor equipment of the ninth embodiment, a value obtained by dividing the reciprocal of a frequency region in which a delay value of the delay circuit 8 is desirably reduced by the duty changing circuit 3 with 4 may be obtained so that a difference between a high period and low period of the system clock S103 is equal to a value obtained by dividing the reciprocal of a frequency region in which a delay value of the delay circuit 8 is desirably reduced with 2.

Therefore, harmonic components each with a frequency of an odd number order of the system clock and harmonic components each with a frequency of an even number order thereof take the same value in a frequency region where harmonics are desired to be reduced. Hence, harmonic components each with a frequency of an even number order of a current I can be reduced, thereby allowing it to provide a semiconductor equipment with less electromagnetic interference.

The semiconductor equipment of the present invention, as described above, includes: an oscillating circuit section to which an oscillator or an oscillating unit is connected, and outputting a source clock; an internal circuit operating in synchronism with the system clock; and a duty changing circuit changing a duty of a source clock outputted from the oscillating circuit section is changed to a predetermined duty shifted away from a value in the vicinity of 50% to output the system clock to the internal circuit, wherein a duty ratio of the system clock is changed to shift a phase of a current consumed in the internal circuit to cancel frequency components concentrating on frequencies each with an even number order of a frequency of the system clock, thereby realizing a semiconductor equipment with less electromagnetic interference.

Since a designing method for the semiconductor equipment of the present invention includes: a phase in which a current analysis in a time domain is performed based on delay information at nodes obtained from layout information and an operating frequency set arbitrarily; a phase in which a result obtained by the current analysis is converted to a frequency domain; and an identification phase identifying a frequency component in a frequency band set arbitrarily, wherein a duty ratio of system clock is repeatedly changed to thereafter perform a current analysis and to thereby determine the best duty ratio and an effect can be predicted with ease in a design flow using a computer to reduce frequency components concentrating on frequencies each of an even number order of a frequency of the system clock. Thereby, radiation radiated from semiconductor equipment can be reduced.

Since a designing method for the semiconductor equipment of the present invention includes: a phase for performing a current analysis in a time domain with delay information at nodes obtained from layout information; a conversion phase for dividing a result obtained by the current analysis phase into a rise time and a fall time of a system clock to convert both to frequency domains; an arithmetic phase for calculating frequency components based on a phase difference between the conversion phase outputs derived from a cycle and a duty ratio of the system clock derived from an operating frequency set arbitrarily; and an identification phase for identifying a frequency component in a frequency band set arbitrarily. By this, while changing a high period or low period of the system clock, the arithmetic phase is performed repeatedly thereby to determine a time difference between the high period and low period. Therefore, the current analysis and the conversion phase, of which calculations are time consuming, are performed only once respectively at a rise time of the system clock and a fall time thereof, so that the best duty ratio can be calculated at high speed without imposing a load on a computer. As a result, frequency components concentrating on frequencies each of an even number order of a frequency of the system clock can be optimally reduced, and excessive radiation from the semiconductor equipment can be reduced.

What is claimed is:

1. A semiconductor equipment comprising:
   an oscillating circuit section connected with an oscillator or an oscillating unit, and outputting a source clock signal;
   an internal circuit for operating synchronously with a system clock; and
   a duty changing circuit for changing a duty of the source clock outputted from the oscillating circuit section to a predetermined duty shifted away from a value of or around 50%, and for outputting the resultant source clock to the internal circuit as a system clock, wherein the duty changing circuit comprises:
      a delay generating section comprising a plurality of delay elements connected in series to each other and having an input from the source clock outputted from the oscillating circuit section;
      a first logic gate for calculating a logic product of a plurality of outputs from arbitrary stages of the plurality of delay elements comprising the delay generating section;
      a second logic gate for calculating a logic sum of a plurality of outputs from arbitrary stages of the plurality of delay elements comprising the delay generating section; and
      a latch circuit for switching between a high output and a low output according to output signals from the first logic gate and the second logic gate, and for outputting the signals as the system clock, wherein a signal with a largest delay amount is inputted only to the first logic gate, the signal being outputted from the delay generating section, wherein the internal circuit comprises:
         an operation circuit section for operating synchronously with one of a leading edge and a trailing edge of a signal outputted by the system clock, and
         a CTS circuit adjusting an arrival timing of a signal outputted by the system clock at the operation circuit section.

2. The semiconductor equipment according to claim 1, wherein the duty changing circuit comprises a logic gate for calculating a logical sum or logical product of the source clock outputted from the oscillating circuit section and a clock obtained by supplying and inputting thereto the source clock through signal paths each having a different delay amount, and outputting the logical sum or logical product as the system clock.

3. A semiconductor equipment comprising:
   an oscillating circuit section connected with an oscillator or an oscillating unit, and for outputting a source clock;
   an internal circuit signal for operating synchronously with a system clock; and
   a duty changing circuit for changing a duty of the source clock outputted from the oscillating circuit section to a predetermined duty shifted away from a value of about 50%, and for outputting the resultant source clock signal to the internal circuit as a system clock, wherein the internal circuit comprises:
   an operation circuit section operating in synchronism with one of a leading edge and a trailing edge of a signal outputted by the system clock, and
   a CTS circuit adjusting an arrival timing of a signal outputted by the system clock at the operation circuit section, wherein the duty changing circuit comprises:
      a delay generating section comprising a plurality of delay elements connected in series to each other and having an input from the source clock outputted from the oscillating circuit section;
      a first logic gate for calculating a logic product of a plurality of outputs from arbitrary stages of the plurality of delay elements comprising the delay generating section;

a second logic gate for calculating a logic sum of a plurality of outputs from arbitrary stages of the plurality of delay elements comprising the delay generating section; and a latch circuit for switching between a high output and a low output according to output signals from the first logic gate and the second logic gate, and for outputting the signals as the system clock, for inputting a signal with a largest delay amount is inputted only to the second logic gate, the signal being outputted from the delay generating section.

4. The semiconductor equipment according to claim 2, wherein the duty changing circuit further comprises a logic gate for selecting by a selection circuit one of the signal paths each having a different delay amount to output therethrough the source clock outputted from the oscillating circuit section, and for outputting as the system clock a logic sum or logic product of an output of the selection circuit and the source clock.

5. The semiconductor equipment according to claim 1, wherein the duty changing circuit further comprises:

a setting circuit for selecting a plurality of outputs from arbitrary stages of the plurality of delay elements comprising the delay generating section, and supplying the source clock and the selected plurality of outputs to an input of the first logic gate; and a setting circuit for selecting a plurality of outputs from arbitrary stages of the plurality of delay elements comprising the delay generating section, and for supplying the source clock and the selected plurality of outputs to an input of the second logic gate.

6. The semiconductor equipment according to claim 1, wherein the duty changing circuit further comprises a setting circuit for changing a switching level of an inverter circuit having an input supplied with the source clock, whereby the system clock is outputted from an output of the inverter circuit.

7. The semiconductor equipment according to claim 6, wherein the inverter circuit comprises a P channel transistor and an N channel transistor each having a gate supplied with a signal outputted by the source clock, the P channel transistor having a source connected to a power supply voltage, the N channel transistor having a source being grounded, the P channel transistor and the N channel transistor respectively having drains which are connected to each other, and the setting circuit is configured so that a combination of on and off states of a plurality of transistors connected in parallel can be set between the drain of the P channel transistor and the N channel transistor and the ground or between the drain of the P channel transistor and the N channel transistor and the power supply voltage.

8. The semiconductor equipment according to claim 6, wherein the inverter circuit comprises a P channel transistor and an N channel transistor each having a source gate supplied with a signal outputted by the source clock, the P channel transistor having a source connected to a power supply voltage, the N channel transistor having a source being grounded, the P channel transistor and the N channel transistor respectively having drains which are connected to each other, and the setting circuit is configured so that a duty setting signal is applied to a gate of a transistor connected between the source of the P channel transistor and the power supply voltage or between the source of the N channel transistor and the ground, and the switching level of the inverter circuit is changed according to a potential of the duty setting signal thereby to output the system clock signal from the output of the inverter circuit.

9. A designing method for a semiconductor equipment, the semiconductor equipment comprising:

an oscillating circuit section connected with an oscillator or an oscillatinn unit, and for outputting a source clock signal;

an internal circuit for operating synchronously with a system clock; and a duty changing circuit for changing a duty of the source clock outputted from the oscillating circuit section to a predetermined duty shifted away from a value of or around 50%, and for outputting the resultant source clock to the internal circuit as a system clock, wherein the duty changing circuit comprising:

a delay generating section comprising a plurality of delay elements connected in series to each other and having an input supplied with the source clock outputted from the oscillating circuit section;

a first logic gate for calculating a logic product of a plurality of outputs from arbitrary stages of the plurality of delay elements comprising the delay generating section;

a second logic gate for calculating a logic sum of a plurality of outputs from arbitrary stages of the plurality of delay elements comprising the delay generating section; and a latch circuit for switching between a high output and a low output according to output signals from the first logic gate and the second logic gate, and for outputting the signals as the system clock, wherein a signal with a largest delay amount is inputted only to the first logic gate, the signal being outputted from the delay generating section, wherein the internal circuit comprising:

an operation circuit section for operating synchronously with one of a leading edge and a trailing edge of a signal outputted by the system clock, and a CTS circuit adjusting an arrival timing of a signal outputted by the system clock at the operation circuit section;

the method comprising:

performing a current analysis in a time domain, based on each node delay information obtained from layout information and with an operating frequency set arbitrarily;

converting a result obtained from the current analysis to a frequency domain; and identifying a frequency component in a frequency band set arbitrarily, and repeatedly performing the current analysis while changing a duty ratio of a system clock, thereby to determine the duty ratio.

10. A designing method for a semiconductor equipment, the semiconductor equipment comprising:

an oscillating circuit section connected with an oscillator or an oscillating unit, and for outputting a source clock signal;

an internal circuit for operating synchronously with a system clock; and a duty changing circuit for changing a duty of the source clock outputted from the oscillating circuit section to a predetermined duty shifted away from a value of or around 50%, and for outputting the resultant source clock to the internal circuit as a system clock, wherein the duty changing circuit comprising:
  a delay generating section comprising a plurality of delay elements connected in series to each other and having an input supplied with the source clock outputted from the oscillating circuit section;
  a first logic gate for calculating a logic product of a plurality of outputs from arbitrary stages of the plurality of delay elements comprising the delay generating section;
  a second logic gate for calculating a logic sum of a plurality of outputs from arbitrary stages of the plurality of delay elements comprising the delay generating section; and
  a latch circuit changing over between a high output and a low output according to output signals from the first logic gate and the second logic gate, and outputting the signals as the system clock, wherein a signal with a largest delay amount is inputted only to the first logic gate, the signal being outputted from the delay generating section, wherein the internal circuit comprising:
    an operation circuit section for operating synchronously with one of a leading edge and a trailing edge of a signal outputted by the system clock, and
    a CTS circuit adjusting an arrival timing of a signal outputted by the system clock at the operation circuit section;
the method comprising:
performing a current analysis in a time domain based on node delay information obtained from layout information;
dividing a result obtained from the current analysis phase into a rise time and a fall time of a system clock, and converting each of the divided results to a frequency domain;
calculating a frequency component of each frequency domain based on a phase difference between the conversion phase outputs derived from a cycle and a duty ratio of a system clock derived from an operating frequency set arbitrarily; and
identifying a frequency component in a frequency band set arbitrarily, and
repeatedly performing the arithmetic phase while changing a duty ratio of the system clock, thereby to determine the duty ratio.

11. A designing method for a semiconductor equipment, the semiconductor equipment comprising:
  an oscillating circuit section connected with an oscillator or an oscillating unit, and for outputting a source clock signal;
  an internal circuit for operating synchronously with a system clock; and
  a duty changing circuit for changing a duty of the source clock outputted from the oscillating circuit section to a predetermined duty shifted away from a value of or around 50%, and for outputting the resultant source clock to the internal circuit as a system clock, wherein the duty changing circuit comprising:
    a delay generating section comprising a plurality of delay elements connected in series to each other and having an input supplied with the source clock outputted from the oscillating circuit section;
    a first logic gate for calculating a logic product of a plurality of outputs from arbitrary stages of the plurality of delay elements comprising the delay generating section;
    a second logic gate for calculating a logic sum of a plurality of outputs from arbitrary stages of the plurality of delay elements comprising the delay generating section; and
    a latch circuit for switching between a high output and a low output according to output signals from the first logic gate and the second logic gate, and for outputting the signals as the system clock, wherein a signal with a largest delay amount is inputted only to the first logic gate, the signal being outputted from the delay generating section, wherein the internal circuit comprising:
      an operation circuit section for operating synchronously with one of a leading edge and a trailing edge of a signal outputted by the system clock, and
      a CTS circuit adjusting an arrival timing of a signal outputted by the system clock at the operation circuit section;
the method comprising:
performing a current analysis in a time domain based on node delay information obtained from layout information;
dividing a result obtained from the current analysis phase into a rise time and a fall time of a system clock, and converting each of the divided results to a frequency domain;
calculating a frequency component of each frequency domain based on a phase difference between the conversion phase outputs derived from a cycle and a duty ratio of a system clock derived from an operating frequency set arbitrarily; and
identifying a frequency component in a frequency band set arbitrarily, and
repeatedly performing the arithmetic phase while changing a high period or low period of the system clock, thereby to determine a time difference between the high period and the low period.

12. The semiconductor equipment according to claim 1, wherein a time difference between the high period and the low period of the system clock is a value obtained by dividing by 2 a reciprocal of a frequency region desired to be reduced.

13. The semiconductor equipment according to claim 1, wherein a time difference between the high period and the lower period of the system clock is in a range of 4 ns to 6 ns.

* * * * *